United States Patent [19]

Yamada et al.

[11] Patent Number: 5,023,462
[45] Date of Patent: Jun. 11, 1991

[54] PHOTO-CATHODE IMAGE PROJECTION APPARATUS FOR PATTERNING A SEMICONDUCTOR DEVICE

[75] Inventors: Akio Yamada, Kasasaki; Kiichi Sakamoto, Tokyo; Jinko Kudou, Kawasaki; Hiroshi Yasuda, Yokohama, all of Japan

[73] Assignee: Fujitsu Limited, Kawasaki, Japan

[21] Appl. No.: 327,728

[22] Filed: Mar. 23, 1989

[30] Foreign Application Priority Data

Mar. 23, 1988 [JP] Japan .................................. 63-68762
Mar. 31, 1988 [JP] Japan .................................. 63-76408
Jun. 15, 1988 [JP] Japan .................................. 63-148945

[51] Int. Cl.$^5$ ............................................. H01J 37/317
[52] U.S. Cl. ..................................... 250/492.2; 250/398
[58] Field of Search ................. 250/492.24, 492.2, 398

[56] References Cited

U.S. PATENT DOCUMENTS

| | | | |
|---|---|---|---|
| 4,460,831 | 7/1984 | Oettinger et al. | 250/492.24 |
| 4,695,732 | 9/1987 | Ward | 250/492.24 |
| 4,705,956 | 11/1987 | Ward | 250/492.24 |
| 4,789,786 | 12/1988 | Yasuda et al. | 250/492.24 |

FOREIGN PATENT DOCUMENTS 2177847 1/1987 United Kingdom ................ 250/398

*Primary Examiner*—Jack I. Berman
*Attorney, Agent, or Firm*—Staas & Halsey

[57] ABSTRACT

A photo-cathode image projection apparatus includes a light source for producing an optical beam, a photoelectron mask disposed so as to be irradiated by the optical beam and a photoelectron mask patterned according to a desired pattern with a material that emits photoelectrons in response to irradiation by an optical beam. The apparatus also includes a focusing device for focusing the emitted photoelectrons to form a photoelectron beam focused on the object, an acceleration electrode disposed along the path of the photoelectron beam for accelerating the photoelectrons in the beam, an elongated passage defined in the acceleration electrode to permit passage of a part of the photoelectron beam, and a stage disposed for supporting the object in a position such that the focused photoelectron beam is focused on the object. Also included is a voltage source for applying an acceleration voltage between the photoelectron mask and the acceleration electrode. The acceleration electrode is held at an electrical potential level that is identical to the electrical potential level of the stage, so that the object supported on the stage is electrically shielded from the photoelectron mask by the acceleration electrode.

25 Claims, 15 Drawing Sheets

DIRECTION OF THE SLIT

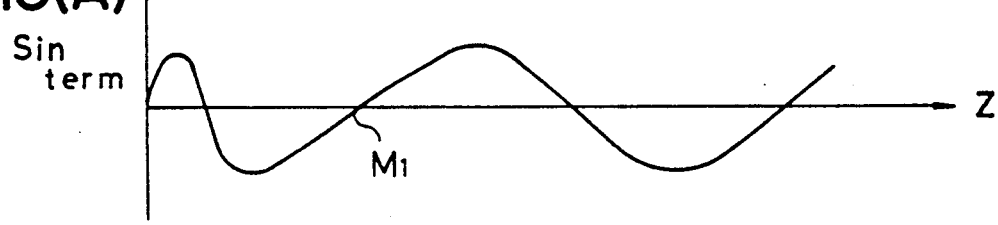
FIG.13(A) Sin term
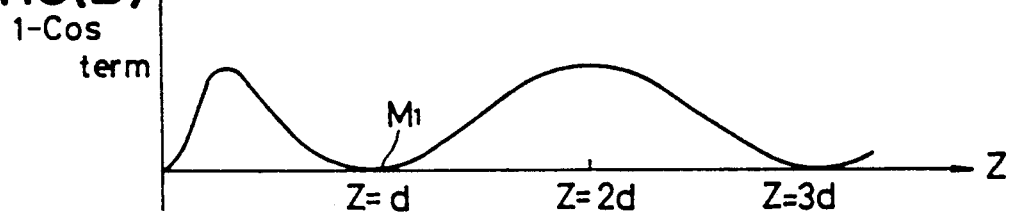
FIG.13(B) 1-Cos term
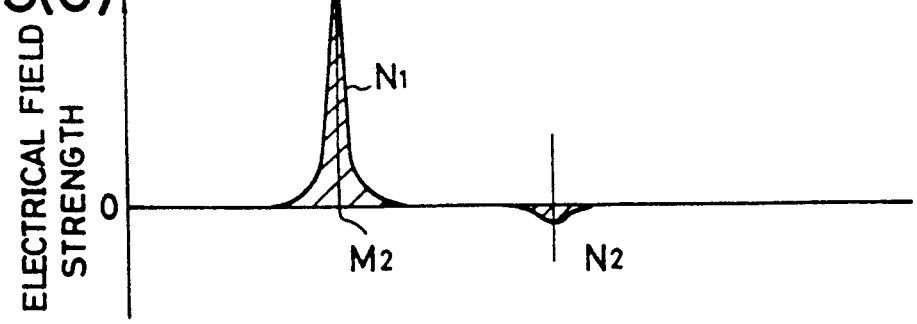
FIG.13(C)

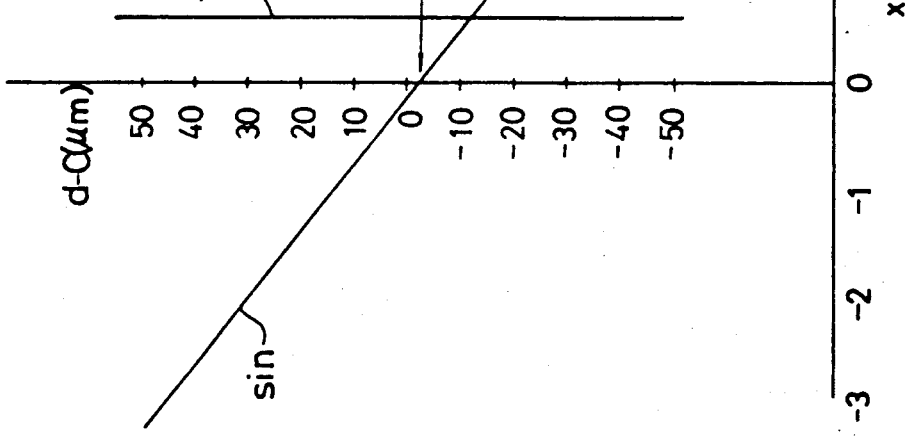
FIG. 14(A) d=10mm d2=400μm
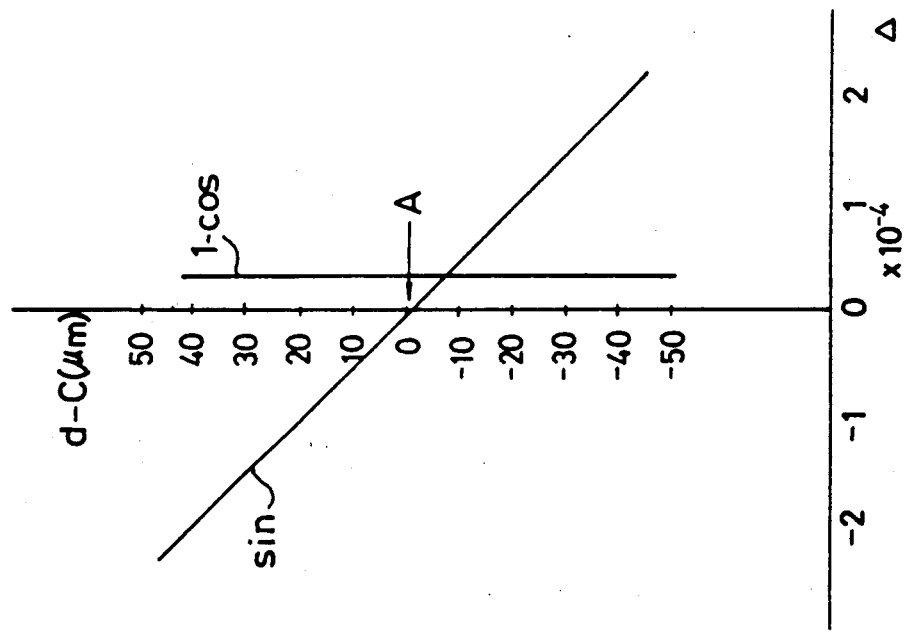
FIG. 14(B) d=10mm d2=500μm

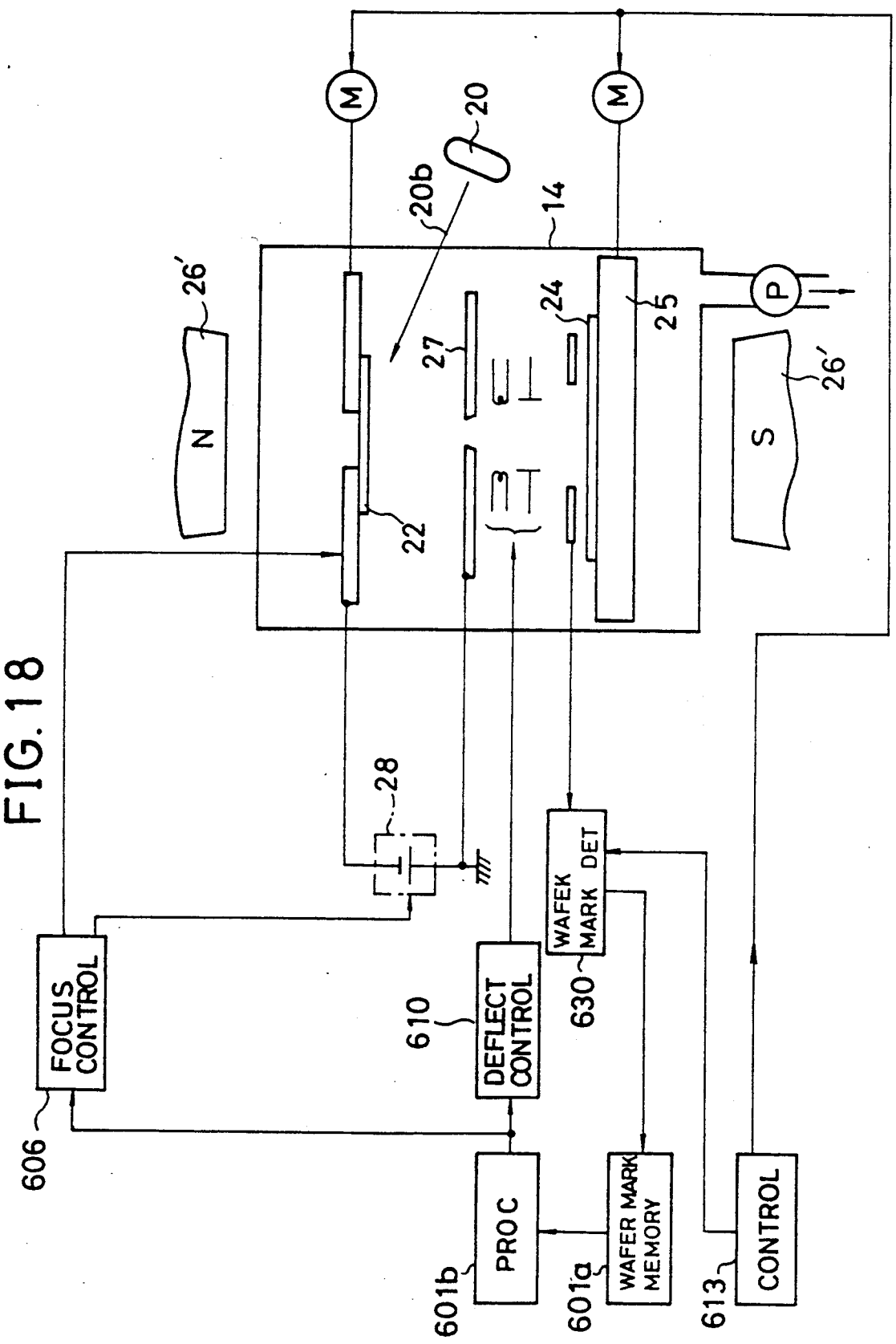

PHOTO-CATHODE IMAGE PROJECTION APPARATUS FOR PATTERNING A SEMICONDUCTOR DEVICE

BACKGROUND OF THE INVENTION

The present invention relates generally to the fabrication of integrated circuits, and more particularly to a photo-cathode image projection apparatus used for patterning semiconductor devices for use in the fabrication of integrated circuits.

In the fabrication of semiconductor integrated circuits which include numerous semiconductor devices such as very large scale integrated circuits (VLSI), extremely fine patterning is required so as to provide as many semiconductor devices as possible in a unit area. Conventionally, photolithography techniques employing ultraviolet radiation are used for this purpose. Responsive to the ultraviolet irradiation, an optical image of a desired device is focused on a photoresist deposited on a wafer or substrate through a suitable mask, and the photoresist is thus exposed to the ultraviolet irradiation in accordance with the desired pattern of the semiconductor device. Such patterning using ultraviolet light or other forms of visible and invisible light, though capable of providing a high throughput, has a basic limitation in that the minimum line thickness attainable in the patterning is limited by the relatively large wavelength of the light which is typically in the order of 4000 Å. In order to achieve patterning that is finer than that which is achieved using photolithography, various techniques have been developed using other types of radiations. Among others, electron beam lithography using an electron beam as the radiation, X-ray beam lithography using an X-ray beam as the radiation, and photo-cathode image projection techniques using a photoelectron beam emitted in response to irradiation of a suitable material by an optical beam as the radiation, are being widely studied.

In the electron beam irradiation technique, an electron beam having a circular or rectangular cross-section is used for exposing the photoresist. At the time of patterning, the electron beam is deflected and moved over the surface of the wafer according to a predetermined pattern. Simultaneously, the wafer itself is moved. For focusing, shaping and deflection of the electron beam, a column system including an electromagnetic lens and an acceleration system is used. Further, a stage system is used for supporting and moving the wafer in a direction so that a desired image of pattern is written on the wafer in cooperation with the movement of the electron beam. Using a suitable acceleration voltage, a very fine image pattern can be written without using a mask. However, this technique of electron beam irradiation requires a significant time for exposure as the electron beam writes the pattern on the surface of the wafer in "one stroke" which means that the electron beam is moved over the surface of the wafer without interruption for the entire pattern. Thus, the throughput obtained by this method is relatively low and therefore this technique is not suited for mass production.

The X-ray beam lithography is a proximity printing technique in which the mask and the photoresist are separated by a minute gap, and an X-ray having a wavelength in the order of 1-10 Å is used for the irradiation. This technique, though capable of providing improved resolution as compared to the conventional photolithography technique, has a problem in that a bulky X-ray generator has to be used for the X-ray source. Further, there is a problem in that the wafer, X-ray source and the mask must be aligned with extremely high precision. For this purpose, a specially designed aligner has to be used. Even so, there is a tendency for the gap between the mask and the wafer to deviate from a nominal or design value particularly when the diameter of the wafer is increased. In such a case, the gap between the mask and a wafer surface tends to vary from one position to another due to deformation of the mask or non-flat surface of the wafer. Such changes in the gap result in a blurring of the image pattern on the wafer. Further, there is a problem in that the material which can be used for the mask is limited because such a mask must absorb X-rays. Furthermore, the intensity of the X-ray beams obtained from commonly available X-ray generators i usually not sufficient for an efficient patterning operation. In other words, the throughput achieved by X-ray beam lithography is too small for mass production of integrated circuits. Of course, it is possible to consider using an intense X-ray beam such as is produced by a synchrontron orbit radiation ring (SOR) for this purpose. However, such a facility has an enormous size and is too expensive for a practical facility for fabrication of integrated circuits.

The photo-cathode image projection technique is advantageous as it provides high resolution comparable to that of electron beam lithography in combination with high throughput comparable to that of photolithography. In this technique, a material capable of emitting electrons when irradiated by a light and another material capable of emitting electrons are patterned on a mask according to the desired pattern, and the photoelectrons emitted from the mask are focused on the surface of the wafer which is coated with a photoresist. The photoelectrons emitted from the mask are accelerated and focused by magnetic and electric fields established between the mask and the wafer, and a semiconductor pattern image corresponding to the pattern formed on the mask is transferred to the photoresist covering the surface of the wafer.

Thus, a typical photo-cathode image projection apparatus comprises a mask such as the one already described, a stage for supporting the wafer coated with the photoresist, a focusing coil for focusing the photoelectrons on he wafer, a high voltage source which applies a high voltage between the mask and the stage for acceleration of the photoelectrons, and an evacuated chamber for accommodating the mask and the stage.

In such an apparatus, there is a problem in that an electrical discharge tends to occur between the mask and the wafer on the stage because of the high acceleration voltage between the mask and the wafer. When such an electrical discharge occurs, a part of the photoresist on the wafer is evaporated and scatters in the chamber. Thus, there is a substantial risk that a part of the photoresist thus scattered contaminates the mask. When this happens, the pattern on the mask is damaged and a defect is introduced into the pattern on the mask. The defect thus brought into the pattern on the mask is transferred to all of the semiconductor devices thereafter patterned on the wafer.

Further, there is another problem in that, as a result of the existence of the high acceleration voltage between the mask and the substrate, back-scattered electrons emitted from the wafer responsive to the irradiation of the wafer by the electron beam for positioning purpose, may be returned to the wafer. When such back-scattered electrons return and reach the photoresist, a part of the photoresist which should not be exposed to electrons undesirably becomes exposed. Furthermore, there is a problem in that the electrical field in the vicinity of the wafer is disturbed significantly when the surface of the wafer is not completely flat. This is due to the fact that the wafer itself is used as one of the electrodes across which the high acceleration voltage is applied. Such a disturbance in the electrical field in the vicinity of the wafer invites a significant distortion in the image of the semiconductor pattern on the wafer.

SUMMARY OF THE INVENTION

Accordingly, it is a general object of the present invention to provide a novel and useful photo-cathode image projection apparatus wherein the aforementioned problems are eliminated.

Another object of the present invention is to provide a photo-cathode image projection apparatus for focusing photoelectrons emitted from a mask patterned with a material which releases photoelectrons responsive to optical irradiation onto a surface of a wafer held on a stage, and wherein a screening electrode plate having a slit therein for passing the emitted photoelectrons is positioned between the mask and the stage and is maintained in a state such that the electrode plate and the stage are at the same electrical potential level. According to the present invention, electrical discharge between the wafer and the mask due to high acceleration voltage between the wafer and mask is eliminated by the screening electrode plate and the risk to the pattern on the mask being damaged by scattering of the photoresist is substantially reduced. Even if an electrical discharge occurs, almost all the scattered photoresist is stopped by the electrode plate located between the stage and the mask, and contamination of the mask by scattered photoresist is thus prevented. Further, since there is no substantial electrical field between the electrode plate and the stage, the chance that back-scattered electrons emitted from the wafer in response to the incidence of the photoelectron beam will return to the wafer resulting in the unwanted exposure of the photoresist is negligible.

Another object of the present invention is to provide a method of patterning a semiconductor device on a semiconductor wafer by irradiating a surface of the semiconductor wafer by a photoelectron beam emitting from a photoelectron mask patterned with a material which releases photoelectrons responsive to an optical irradiation, wherein the photoelectron beam is shaped to have a thin linear cross-section extending in a first direction in correspondence to a linear portion in the photoelectron mask. The linear portion of the mask, extending in said first direction and thus corresponding to the portion of the mask where the photoelectron beam is produced responsive to the optical irradiation, is caused to move across the masks in a direction perpendicular to the elongated dimension of the cross-section of the beam during exposure of the wafer by moving the optical irradiation relative to the photoelectron mask, and responsive thereto, the photoelectron beam is moved in a second direction. Further, the wafer is moved in a direction that is parallel to said second direction with a predetermined speed relative to the speed of movement of the photoelectron beam. According to the present invention, the entire image pattern of the semiconductor device is projected on the semiconductor wafer through a thin slit in an electrode plate which shields the semiconductor wafer from an electrical field of the photoelectron mask without causing electrical discharge between the photoelectron mask and the wafer. Further, the image pattern of the semiconductor device is expanded or compressed as desired in said second direction by changing the relative speed of the movement of the beam and the wafer.

Another object of the present invention is to provide a photo-cathode image projection apparatus for focusing photoelectrons emitting form a mask subjected to a high acceleration voltage and patterned with a material which releases photoelectrons responsive to irradiation by light. The emitted electrons are focused on a surface of a wafer held on a stage through a screening electrode plate held at an electrical potential level that is identical to that of the stage and which electrode plate has a slit for passing part of the photoelectrons emitted from the mask, wherein additional electrode means are provided between the stage and the electrode plate for correcting the path of the photoelectron beam reaching the wafer. According to the present invention, changes in the path of the photoelectron beam due to a disturbed electrical field at the elongated slit of the electrode plate are corrected by the additional electrode means. Thus, the distortion in the image of the pattern of the wafer due to such changes in the path of the photoelectron beam is corrected easily and a proper patterning of the semiconductor device is achieved.

Still another object of the present invention is to provide a photo-cathode image projection apparatus for focusing photoelectrons emitted from a mask patterned according to a desired pattern by a material which emits photoelectrons in response to irradiation by light, on a surface of a wafer held on a stage through a screening electrode disposed between the photoelectron mask and the wafer and having an elongated slit therein, wherein the stage is moved with respect to said screening electrode in a direction that is perpendicular to the elongated dimension of the slit, and distortions in the image pattern projected on the wafer are corrected by detecting the position of a reference part on the wafer provided in correspondence to a positioning mark on the mask for positioning purposes. According to the present invention, the distortion of the image projected on the wafer is automatically corrected, and a continuous exposure of numerous patterns on the wafer is achieved by using such a reference part on the wafer as the positioning reference of the photoelectron beam.

Still other objects and further features of the present invention will become apparent from the following detailed description when read in conjunction with the attached drawings.

BRIEF DESCRIPTION OF THE DRAWINGS

FIGS. 13(a)-(c) are graphs showing the distortion of an image projected on the wafer for the case of the apparatus of FIG. 11;

FIGS. 14(a)-(d) are graphs showing various distortion components together with corresponding parameters;

FIG. 18 is a diagram similar to FIG. 15 showing a modification of the apparatus of FIG. 15.

DETAILED DESCRIPTION

Figure 1:
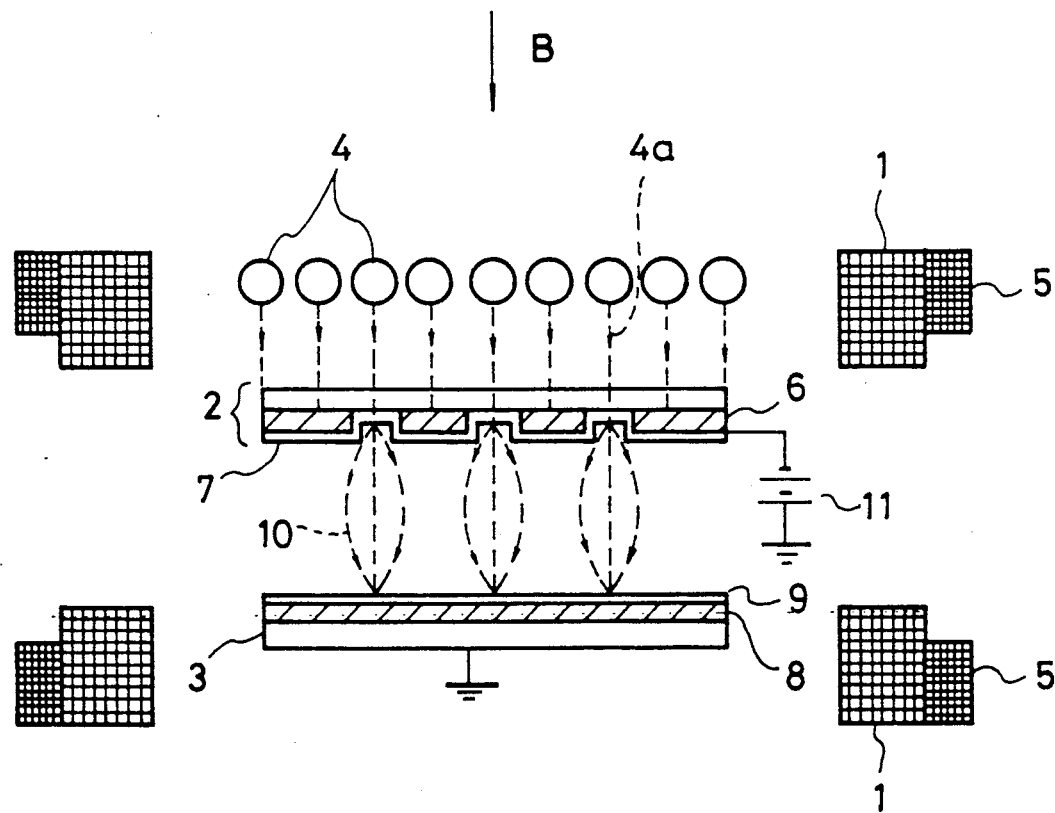
FIG. 1 is a schematical cross-section showing the general construction of a prior art photo-cathode image projecting apparatus.

FIG. 1 shows an example of a prior art photo-cathode image projection apparatus. Referring to FIG. 1, a focusing coil 1 creates a parallel magnetic field B extending vertically as illustrated, and a photoelectron mask 2 carrying a pattern to be projected on a semiconductor wafer and a stage 3 for supporting the semiconductor wafer, are disposed perpendicularly to the direction of the magnetic field B in such a state that the mask 2 and the stage 3 face each other. Further, the mask 2 is held at a negative electrical potential level with respect to the stage 3 by a d.c. voltage source 11 producing an acceleration voltage so that photoelectrons emitted from the mask 2 are accelerated towards the stage 3. The side of the mask 2 which is away from the stage 3 is irradiated by a light from a light source 4 producing an ultraviolet light, and responsive to the irradiation, photoelectrons are emitted from the mask from the side which faces the stage 3. The electrons thus emitted are focused by the focusing coil 1 and further deflected by another coil 5 which is used for proper positioning of the focused electron beam.

The photoelectron mask 2 comprises a transparent base such as a quartz plate having a thickness of about 500-600 μm, and is provided with a desired semiconductor pattern by a material 6 such as chromium which absorbs the ultraviolet light. Further, another material 7 which releases photoelectrons responsive to irradiation by ultraviolet light such as cesium iodide or platinum is deposited over the material 6. Further, the stage 3 supports a wafer 8 of a semiconductor material on which a photoresist 9 is deposited.

When ultraviolet light 4a is irradiated from the light source 4 onto the photoelectron mask 2, the light reaches the material 7 at those portions where the material 6 is not provided. Responsive to this, the material 7 releases photoelectrons 10. Photoelectrons 10 are accelerated in a direction from the mask 2 to the stage 3 by the acceleration voltage applied between the mask 2 and the stage 3 by a d.c. voltage source 11. Because the magnetic field B is directed downwardly, the photoelectrons move along a spiral path during the acceleration and are focused on the wafer 8. As a result, an image of the pattern on the mask 2 is projected on the photoresist 9 on the wafer 8.

In such a conventional photo-cathode image projection apparatus, there is a problem in that a part of the photoresist 9 on the wafer 8 may be broken and scattered when an electrical discharge occurs between the mask 2 and the wafer 8 on the stage 3. Such an electrical discharge tends to occur as a result of the high acceleration voltage between the mask 2 and the stage 3 particularly when the degree of vacuum of a chamber (not shown) enclosing the mask 2 and the wafer 3 is deteriorated. When such an electrical discharge occurs, there is a substantial risk that a part of the scattered photoresist 9 contaminates the mask 2. More specifically, a part of the scattered photoresist reaches the mask 2 facing the wafer 8, and the pattern of the material 7 on the mask 2 is covered by such a photoresist. Once a defect is introduced into the pattern of the mask 2 as such, the defect is transferred to all the semiconductor devices thereafter patterned by the mask.

In such a prior art photo-cathode image projecting apparatus, there is another problem in that back-scattered electrons reflected by a part of the wafer 8 as a result of irradiation of the wafer by the photoelectrons 10 are returned to the wafer 8 again and the photoresist 9 on the wafer 8 is exposed to such back-scattered electrons. Such a reflection of back-scattered electrons from the wafer 8 occurs particularly when checking the proper positional alignment between the mask 2 and the wafer 8 on the stage 3 by radiating photoelectrons emitted from a particular positioning mark region of the pattern of the mask 2, on a corresponding region defined on the wafer 3. Such exposure of the photoresist 9 to back-scattered electrons is of course harmful, as those parts of the photoresist which should not be exposed to electron beam irradiation are exposed.

Figure 2:
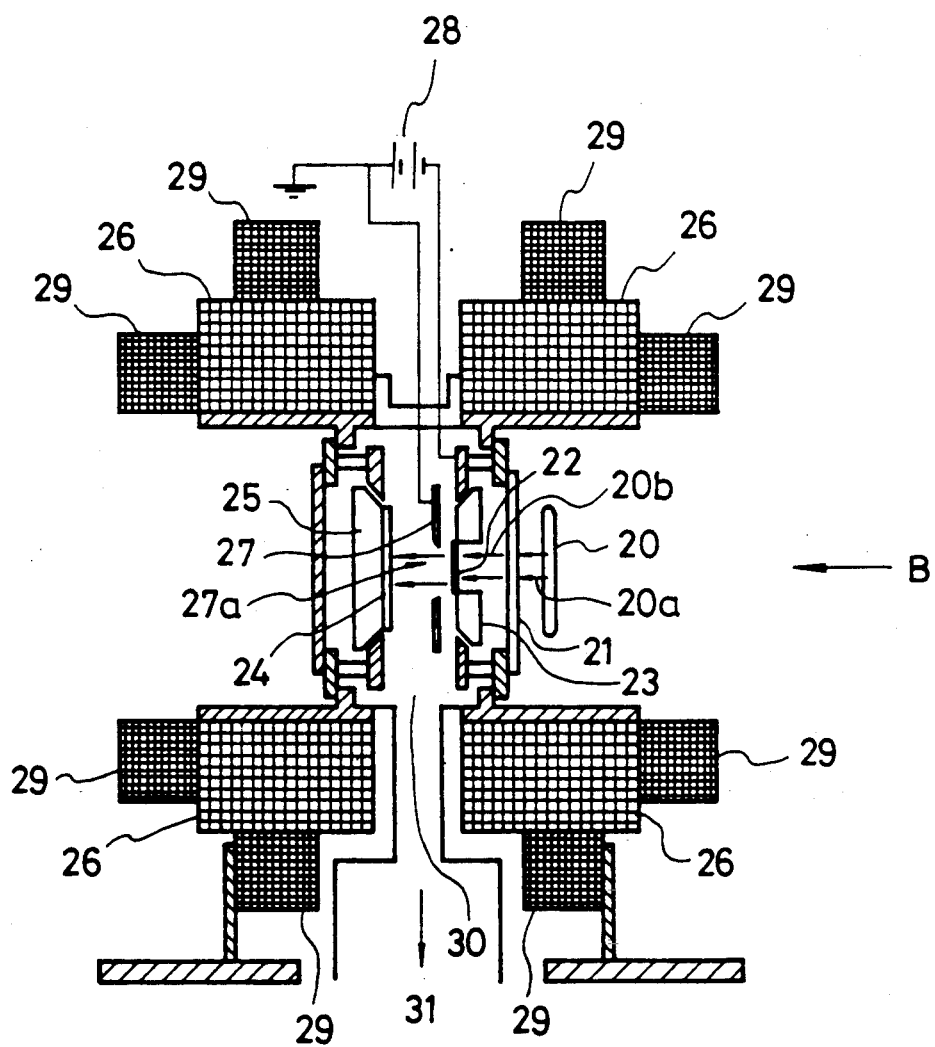
FIG. 2 is a cross-sectional view showing a first embodiment of the photo-cathode image projecting apparatus of the present invention.

FIG. 2 shows a first embodiment of the photo-cathode image projecting apparatus of the present invention. Referring to the drawing, a light source 20 produces an ultraviolet light 20a which is passed through an elongated window 21 and reaches a photoelectron mask 22 supported by a mask stage 23 as a flattened optical beam 20b. The photoelectron mask 22 is constructed similarly to the photoelectron mask 2 of the apparatus of FIG. 1 and emits a photoelectron beam 22a. As the photoelectron mask 22 is identical to the mask 2 of FIG. 1, the description thereof will not be repeated. A semiconductor wafer 24 similar to the wafer 8 is held on a stage 25 and the photoelectrons emitted from the photoelectron mask 22 are focused on the surface of the wafer on which is deposited a photoresist (not shown). Thus, the image of the pattern on the photoelectron mask 22 is projected on the wafer 24. For this purpose a focusing coil 26 similar to the coil 1 of FIG. 1 producing the magnetic field B is used. It should be noted that the magnetic field B extends in parallelism to the general direction of the photoelectron beam. In the present embodiment, there is provided a screening electrode 27 between the photoelectron mask 22 and the wafer 24, and an acceleration voltage is applied between the photoelectron mask 22 and the electrode 27. For this purpose, a d.c. voltage source 28 similar to the d.c. voltage source 11 of FIG. 1 is provided. It should be noted that the electrode 27 is maintained at the ground potential level and the photoelectron mask 22 is held at a very large negative potential level. In order for the photoelectrons emitted from the photoelectron mask 22 to pass through the electrode 27, the electrode 27 is provided with an elongated slit 27a that is parallel to the elongated window 21 and a part of the photoelectron beam 22a that passes through this slit 27 reaches the wafer 24 as a flattened electron beam having a thin linear cross-section. The coil 29 is used for minute adjustment of the image of the pattern projected on the wafer 24 and produces a magnetic field parallel or perpendicular to the magnetic field B. The photoelectron mask 22, the electrode 27 and the wafer 24 on the stage 25 are accommodated in an evacuated chamber 30 which is evacuated at an exhaust outlet 31.

In operation, the photoelectron mask 22 is irradiated by ultraviolet light 20a from the light source 20 at the side thereof that is opposite to the side which faces the electrode 27. Responsive thereto, photoelectrons are released from the mask 22 according to the pattern of the photoelectron material thereon. The photoelectrons are accelerated by the acceleration voltage across the photoelectron mask 22 and the electrode 27 in the direction of the wafer 24 and reach the wafer 24 in the form of an electron beam 22a having a linear or elongated cross-section after passing through the elongated slit 27a.

In this construction of the photo-cathode image projecting apparatus, the electrical potential levels of the electrode 27 and the wafer 24 on the stage 25 are identical. Thus, electrical discharge between the wafer 24 and the photoelectron mask 22 is eliminated and the problem of contamination of the photoelectron mask 22 due to the scattering of the photoresist associated with the discharge is eliminated. Further, the problem of unwanted exposure of the photoresist by back-scattered electrons emitted from the wafer 24 is solved as there is no potential gradient between the wafer 24 and the electrode 27.

Figure 4:
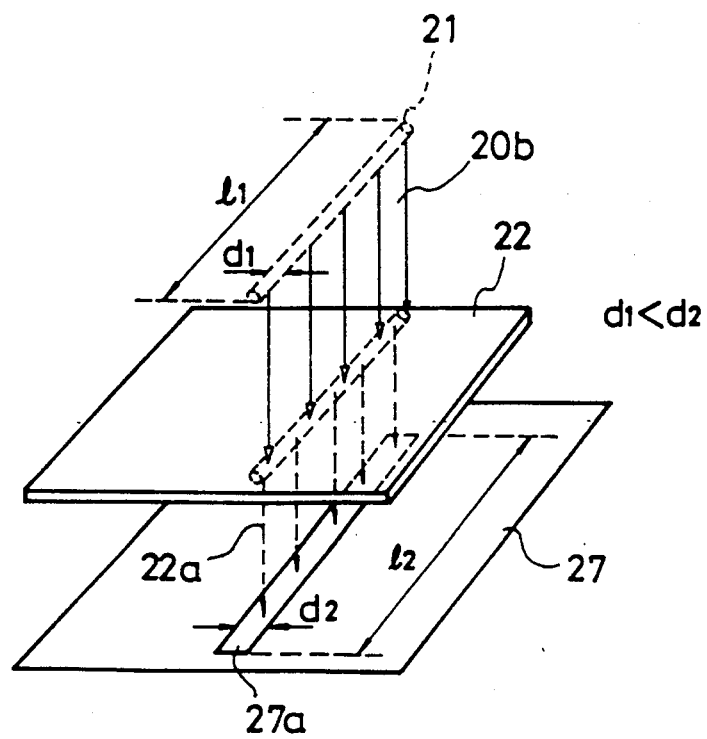
FIG. 4 is a perspective view showing a screening electrode plate used in the apparatus of FIGS. 2 and 3.

The light source 20 may be a mercury-xenon lamp radiating ultraviolet light 20a, and the ultraviolet light 20a is irradiated on the photoelectron mask 22 through the elongated window 21 as already described as the flattened optical beam 20b having a thin linear cross-section. Responsive to the irradiation of the photoelectron mask 22, the photoelectrons are emitted from the mask 22 and the photoelectrons thus emitted are passed through the elongated slit 27a extending parallel to the elongated window 21 in the form of the photoelectron beam 22a. Here, it should be noted that the size of the window 21 and that of the slit 27a are chosen such that the width and thickness of the linear cross-section of the flat optical beam 20b passing through the elongated window 21 is substantially smaller than the width and thickness of the cross-section of the flat electron beam 22a passing through the slit 27a. More specifically, the flat optical beam 20b is shaped by the window 21 to have a linear or elongated cross-section defined by a width $l_1$ and a thickness $d_1$ (FIG. 4) which satisfy the relationships $$l_1 < l_2$$

and $$d_1 < d_2,$$

where $l_2$ and $d_2$ respectively specify the width and thickness of the slit 27a as defined in FIG. 4.

By choosing the width and thickness of the optical beam 20b as such, the photoelectron beam 22a emitted from the mask 22 and passed through the slit 27a of the electrode 27 is not affected by the local electrical field in the vicinity of an edge of the slit 27a. In other words, the photoelectron beam 22a passes through the slit 27a at its central part avoiding the vicinity of the edge regions of the slit 27a and distortion in the projection image on the wafer 24 due to the disturbed electrical potential at such edge region is minimized. Preferably, the thickness $d_2$ of the slit 27a of the electrode 27 is chosen to be about 1/10 to 1/20 of the length of the patterned area of the photoelectron mask 22 viewed in the direction of the thickness $d_2$. This length of the patterened area of the photoelectron mask 22 is of course smaller than the corresponding length of the mask 22 itself. When the chosen thickness $d_2$ is larger than the above value, the distortion in the photoelectron beam passed through the slit 27a becomes too conspicuous as a result of leakage in the local electrical field through the slit 27a into the region between the electrode 27 and the stage 25. Such a local electrical field is strongly distorted as will be described with reference to other embodiments of the present invention and modifies the path of the photoelectron substantially. On the other hand, when the thickness $d_2$ is too small, the efficiency in the patterning is decreased. It is preferred to choose the width $l_2$ of the slit 27a of the electrode 27 to be about 1.2 times to twice as large as the width of the patterned area of the photoelectron mask 22.

In the construction of FIG. 4, it is further possible to choose the position of the light source 20 and the window 21 such that the ultraviolet light 20a radiated from the light source 20 and passed through the window 21 hits the photoelectron mask 22 obliquely. In this construction, the light source 20, the window 21 and the slit 27a are not in straight alignment and unwanted exposure of the photoresist by ultraviolet light reaches the wafer 24 directly after passing through the window 21 and the slit 27a is eliminated.

Figure 5:
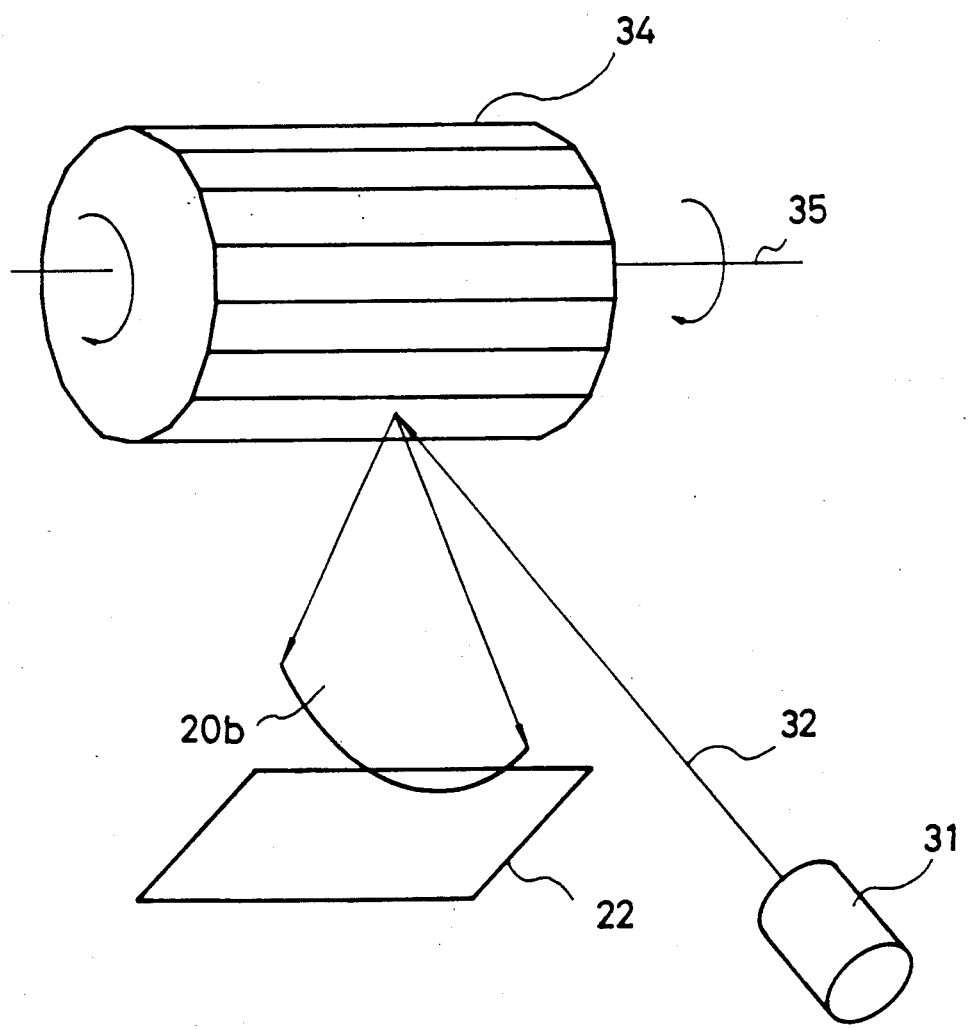
FIG. 5 is a perspective view showing another means for producing a flat electron beam for use in the apparatus of FIGS. 2 and 3.

FIG. 5 shows a modification of the light source 20 in which a laser beam 32 is produced by a laser 31 is deflected by a rotary polygonal mirror 34 rotating about an axis 35. As a result, a flat optical beam 20b similar to the optical beam obtained by passing the ultraviolet light 20a through the window 21 is obtained and this optical beam 20b is irradiated on the photoelectron mask 22. For this purpose, a second order harmonic of the argon laser having a half-wavelength of 257.25 nm or 244 nm may be used.

Figure 3:
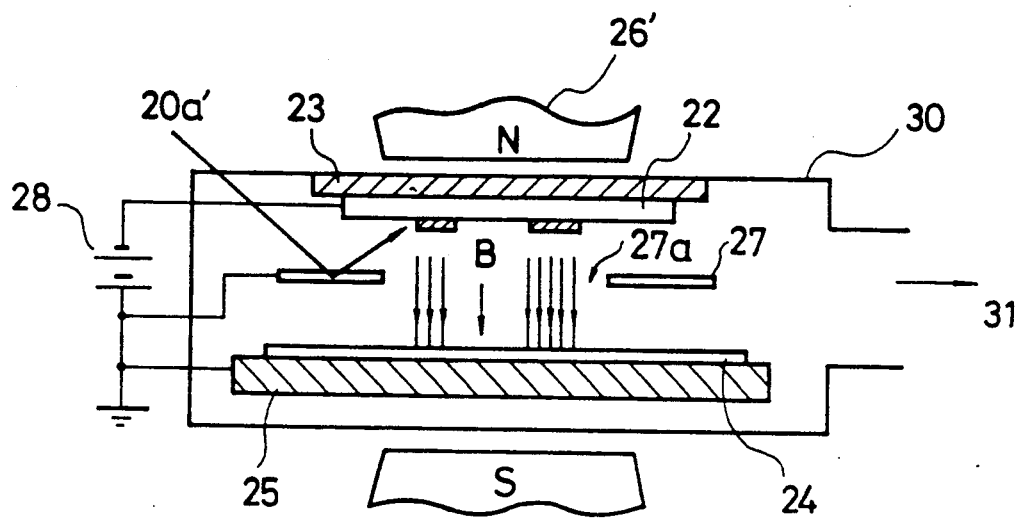
FIG. 3 is a cross-sectional view similar to FIG. 2 showing a modification of the apparatus of the present invention.

FIG. 3 is a modification of the apparatus of FIG. 2 in which a permanent magnet 26' is used for producing the magnetic field B. In FIG. 3 the parts constructed identically to the corresponding parts of FIG. 2 have identical reference numerals and the description thereof will be omitted.

In this construction, an optical beam 20a' is introduced obliquely from the outside of the chamber 30, because the permanent magnet 26' is behind the photoelectron mask 22 and no space is available for the path of the light beam 22a in this region. The optical beam 20a' is reflected by a mirror surface of the electrode 27. In this construction, use of the bulky focusing coil 26 can be omitted and the construction becomes simple.

Figure 6:
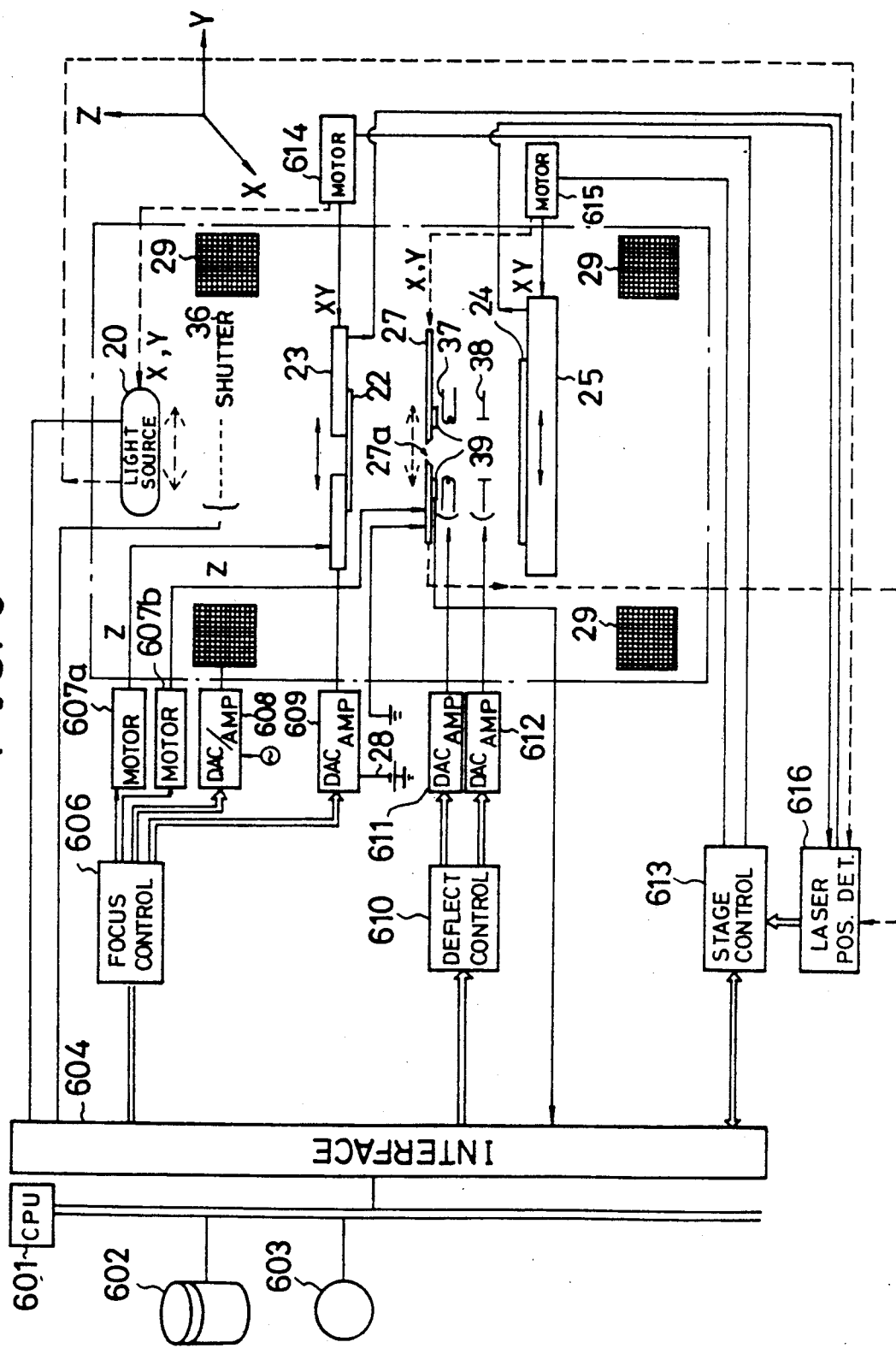
FIG. 6 is a diagram showing the overall construction of a photo-cathode image projecting apparatus of the first embodiment.

FIG. 6 shows the overall construction of the apparatus of FIG. 2 together with the parts for controlling the various components of FIG. 2. In FIG. 6 the parts constructed identically to the corresponding parts of FIG. 2 are given identical reference numerals and the description thereof is omitted.

Referring to FIG. 6, a central processing unit (CPU) 601 cooperates with a magnetic disk memory 602 and a magnetic tape memory 603 for storing control data and controls the apparatus of FIG. 2 via an interface 604.

More specifically, the CPU 601 controls the light source 20 and a shutter 36 provided in the path of the optical beam 20b via the interface 604. CPUT 601 further controls a focusing control system 606 which in turn controls motors 607a and 607b for moving the mask stage 23 and the electrode 27 up and down respectively in a Z-direction, a driver 608 for energizing the coil 29, and a driver 608 for applying an acceleration voltage to the mask 22 via the mask stage 23. Further, the CPU 601 controls a deflection controller 610 which in turn controls a driver 611 for energizing a magnetic deflector 37 and an electrostatic deflector 38. These deflectors are provided between the electrode 27 and the stage 25 so as to surround the path of the photoelectron beam 22a and deflect the electron beam in X- and Y-directions as defined in FIG. 6. Furthermore, the CPU 601 controls a stage controller 613 which in turn drives a motor 614 for the mask stage 23 and a motor 615 for the stage 25. The stage controller 613 drives the motors 614 and 615 responsive to an output of an X-Y position detector 616 which detects the X-Y position of the mask stage 23 and the stage 25. The X-Y position detector may be a laser interferometer.

Next, the operation of the control parts of FIG. 6 will be described.

First, the light source 20 is turned ON and the shutter 36 is opened. In this state, an operation to achieve an alignment between the mask 22 and the wafer 24 is performed. The alignment is made using a back-scattering electron detector 39 which may be a PIN diode disposed on a side of the electrode 27 facing the wafer 24. First, the photoelectron beam 24a is focused on the slit 27a of the electrode 27 by adjusting the position of both of either one of the mask stage 23 or the electrode 27 in the Z-direction. Further, the distortion, magnification and rotation of the image thus formed at the slit 27a are corrected using the coil 29. Next, the photoelectron mask 22 and the wafer 24 are moved along parallel paths in X-Y planes defined by the X and Y axes by moving the corresponding stages 23 and 25. The speed of movement of the mask and the wafer is determined on the basis of the sensitivity of the photoresist on the wafer 24 and may be chosen to be 10 mm/sec, for example. It should be noted that the light source 20 and the electrode 27 are stationary. According to this procedure, the pattern on the photoelectron mask 22 is transferred to the photoresist on the wafer 24 without magnification or compression. The speed of movement of the photoelectron mask 22 and the wafer 24 is not necessarily constant as long as the photoelectron mask and the wafer are moved at the same speed.

Further it is possible to magnify or compress the image transferred to the photoresist by changing the speed of movement of the photoelectron mask 22 to that of the wafer 24. For example, the image projected on the photoresist on the wafer 24 by the photoelectron beam 22a may be compressed to 1/5 of the size of the pattern on the photoelectron mask 22 in the direction of the movement of the mask and the wafer by reducing the speed of movement of the wafer 24 to 1/5 of the moving speed of the photoelectron mask 22. In such a case, the pattern on the photoelectron mask 22 may be expanded by five times in the direction of movement of the photoelectron mask 22.

The movements of the photoelectron mask 22 and the wafer 24 are made in synchronization under the control of the CPU 601. However, it is inevitable that minute errors will occur in the movement of these parts. In order to correct such errors, the present apparatus uses the laser interferometer 616 for detection of the position of the mask stage 23 and the stage 25 for the wafer. The interferometer 616 produces an output signal indicating an error as aforementioned, and responsive to such output signals, the CPU 601 energizes the electromagnetic deflector 37 and the electrostatic deflector 38 via the deflection controller 610 such that the electron beam is deflected a minute amount corresponding to the error and the error is compensated. For example, the photoelectron beam 22a may be deflected in the same direction as the direction of movement of the mask 22 and the wafer 24 when the speed of movement of the mask 22 is slow relative to the speed of movement of the wafer 24. When the speed of movement of the photoelectron mask 22 is fast relative to the speed of the wafer 24, the photoelectron beam 22a may be deflected in a backward direction relative to the direction of movement of the mask 22 and the wafer 24.

Figure 7:
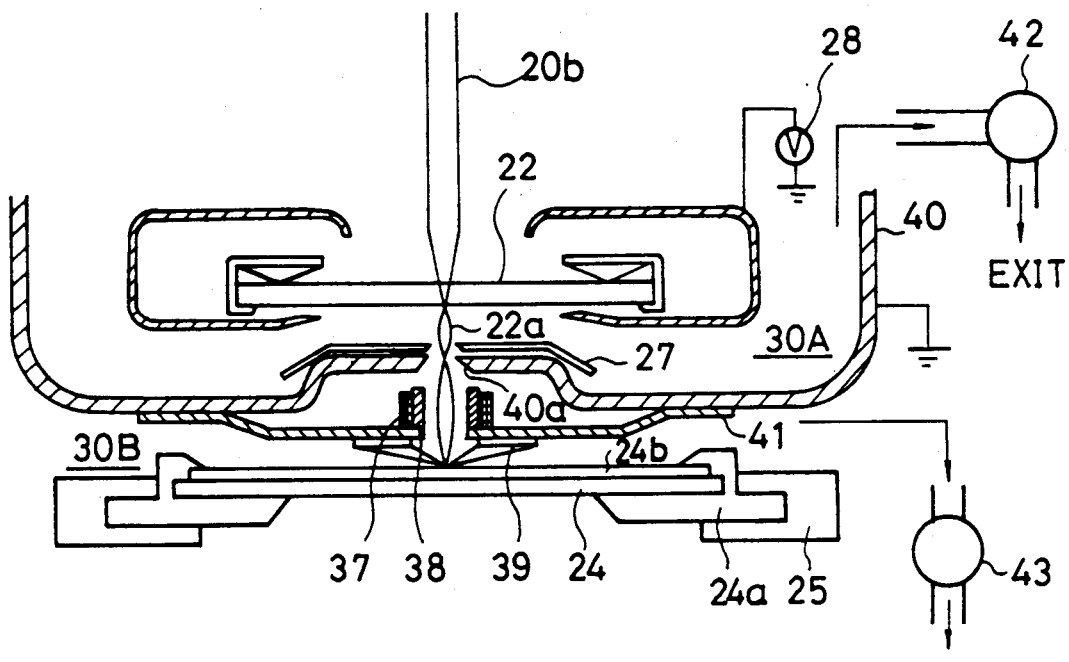
FIG. 7 is a cross-sectional view showing a modification of a part of the apparatus of FIG. 2.

FIG. 7 shows a part of a modification of the apparatus of the present invention in an enlarged scale. In FIG. 7 the parts constructed identically to the corresponding parts of FIG. 2 are given identical reference numerals and the description thereof will be emitted:

Referring to FIG. 7, there is provided a partition wall 40 which divides the chamber 30 into a first chamber region 30A containing the photoelectron mask 22 and the electrode 27 and a second chamber region 30B containing the stage 25 and the wafer 24. The partition wall 40 extends along the electrode 27 and holds a plate 41 on which the magnetic deflector 37, the electrostatic deflector 38 and the back-scattered electron detector 39 are carried, between the wall 40 and the wafer 24. Further, the partition wall 40 has an elongated opening 40a that is registered with the slit 27a of the electrode 27. In FIG. 7, it should be noted that the photoresist on the wafer 24 is illustrated by a reference numeral 41 and the wafer 24 is fixed on the stage 25 by a wafer holder 24a.

In the modification of FIG. 7, the chamber region 30A is evacuated by a pump 42 and the chamber region 30B is evacuated by a pump 43 differentially across the wall 40 which extends along the electrode 27. As a result, the chamber region 30A containing the photoelectron mask 22 and the electrode 27 is maintained at a high degree of vacuum such as $10^{-8}$ Torr irrespective of the existence or non-existence of the wafer 24 on the stage 25. As a result of the fact that the degree of vacuum in the chamber region 30A including the photoelectron mask 22 and the stage across which the high voltage is applied is maintained at such a high level, the apparatus of the modification of FIG. 7 successfully prevents electrical discharge between the photoelectron mask and the electrode.

In the embodiment described heretofore, the photoelectron mask 22 and the wafer 24 are moved while the light source 20 and the electrode 27 are stationary. However, it is also possible to construct the apparatus such that the light source 20 and the electrode 27 are moved while the photoelectron mask 22 and the stage 25 are held stationary. For this purpose, the motor 614 is used to move the light source 20 instead of moving the mask stage 23 and the motor 615 is used to move the electrode 27 instead of moving the stage 24 as indicated in broken line in FIG. 6. Further, the X-Y position of the light source 20 and the electrode 27 are detected by the interferometer 616 as indicated in the drawing. According to this modification, the stage 23 for holding the photoelectron mask 22 to which the high acceleration voltage is applied is held stationary and the design and construction of the apparatus is easier, although such an apparatus cannot be used to magnify or compress the image on the wafer 24.

A second embodiment of the present invention is described with reference to FIGS. 8 through 17. In FIGS. 8 through 17 the parts constructed identically to the corresponding parts of the preceding drawings are given identical reference numerals and the description thereof will be omitted.

Figure 8:
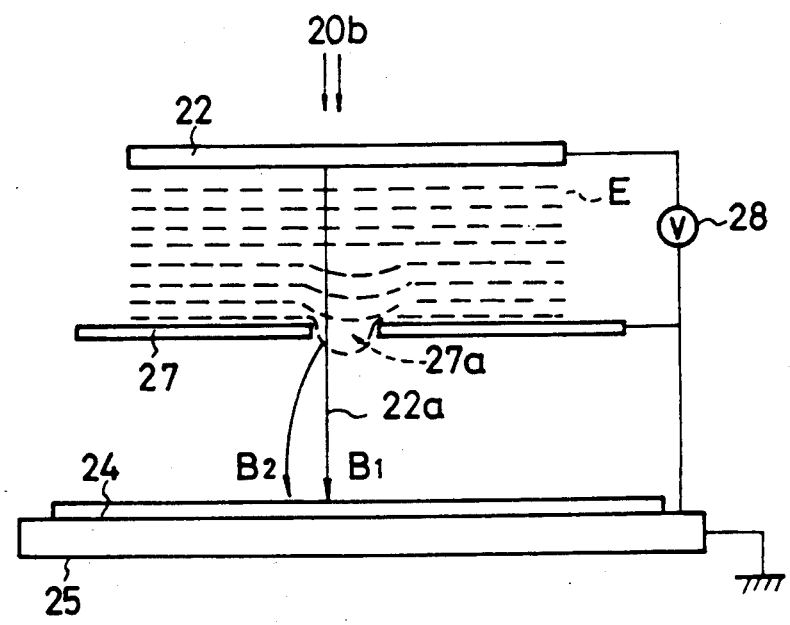
FIG. 8 is a cross-sectional view showing a problem pertaining to the apparatus of the first embodiment.

In the first embodiment of the present invention described heretofore, electrical discharge between the photoelectron mask 22 and the wafer 24 on the stage 25 is successfully eliminated as a result of the use of the electrode 27. However, the use of an electrode 27 provided with a slit 27a causes a problem in that the electrical field established by the high acceleration voltage between the photoelectron mask 22 and the electrode 27 is significantly disturbed in the vicinity of the slit 27a. FIG. 8 shows a typical situation in which the parallelism of the electrical field E is distributed at the region of the slit 27a such that the field leaks into or invades the space defined by the electrode 27 and the stage 25. In this region where the electrical field E is disturbed, the electrical field is no longer parallel and the electron beam 22a passes through the slit 27a is deflected as illustrated. As a result, the electron beam hits the wafer at a position B2 instead of a desired position B1. Such a deflection in the electron beam causes a distortion in the image transferred to the photoresist on the wafer 24.

Figure 9A:
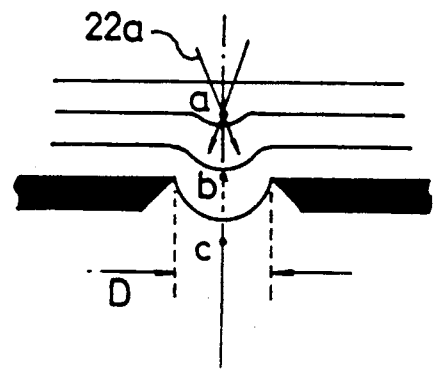
FIG. 9 is a diagram used to explain the distortion of the image due to the disturbance in the electrical field caused in the apparatus of the first embodiment.
Figure 9B:
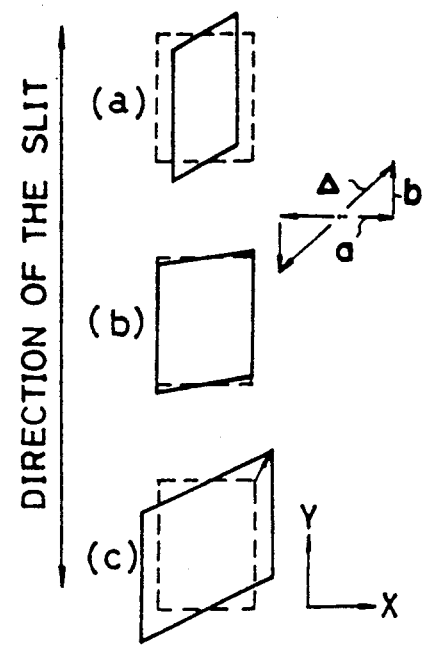

FIGS. 9(A) and (B) show typical examples of the distortion in the image projected on the photoresist on the wafer 24 in which FIG. 9(A) shows various focusing states of the photoelectron beam in the vicinity of the slit 27a and FIG. 9(B) shows the distortion corresponding to the focusing state of FIG. 9(A) in plan view. In FIG. 9(B), the projected image not including distortion is represented by a broken line. It should be noted that a distortion component represented by a vector Δ is represented by superposition of the magnification of the projected image called "gain component" as represented by a vector a and of a "rotation component" of the projected image as represented by a vector b respectively.

When the photoelectron beam 22a is focused at a level higher than the plane of electrode 27 as shown by a point a in FIG. 9(A), the gain component of the distortion represented by the vector a is negative and the image is compressed in a direction perpendicular to the elongated direction of the slit 27a as shown in the case (a). On the other hand, when the photoelectron beam 22a is focused at a level lower than the plane of the electrode 27, the gain component becomes positive and the projected image on the wafer 24 is magnified as shown in the case (c). Further, by choosing the level of the focusing point of the electron beam 22a as shown by a point b which is exactly on the plane of the electrode 27, the gain component of the distortion becomes zero and the magnification of the transferred image on the wafer 24 becomes unity as shown in the case (b) in FIG. 9(B). In other words, the projected image on the wafer 24 has an area identical to the area of the ideal image when the photoelectron beam 22a is focused exactly on the plane of the electrode 27 and then projected on the wafer 24.

Conversely, the rotational component b of the distortion does not appear even when the photoelectron beam 22a is focused exactly on the plane of the electrode 27 as clearly seen in FIG. 9(B). This rotational component of the distortion is caused as a result of the invasion of the electrical field into the region between the electrode 27 and the wafer 24 as illustrated in FIG. 8 and must be cancelled out using other means than the adjustment of the level of the electrode 27.

Figure 10:
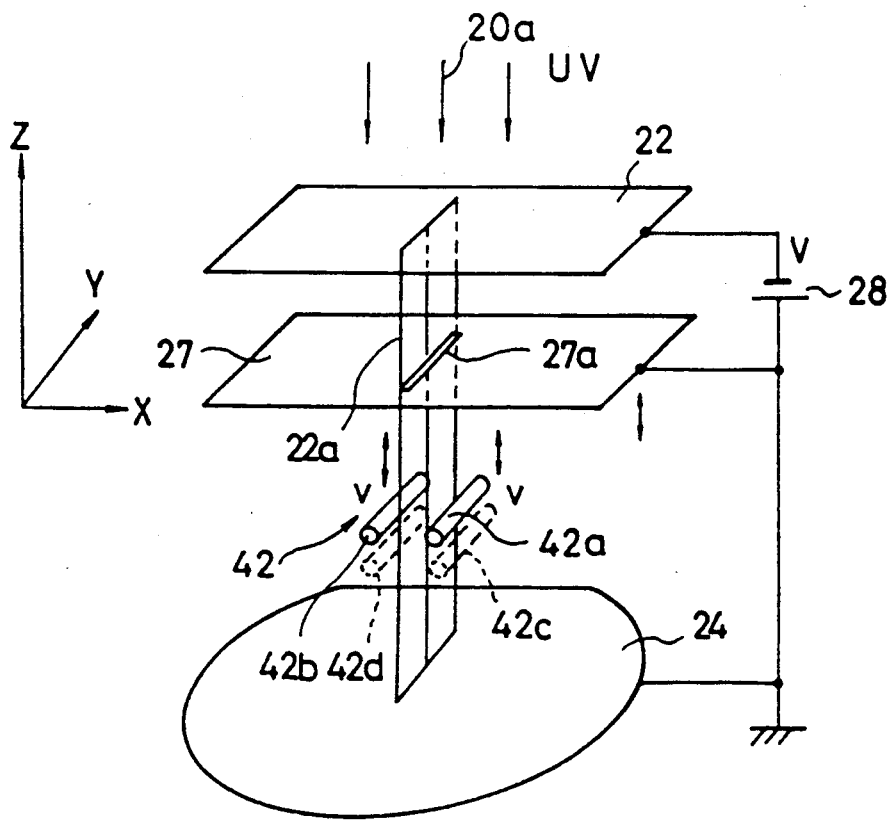
FIG. 10 is a perspective view showing a second embodiment of the present invention wherein the problems shown in FIGS. 8 and 9 are eliminated.

FIG. 10 shows the principle of the cancellation of the rotational distortion component of the projected image on the wafer 24 according to a second embodiment of the photo-cathode image projection apparatus of the present invention. In FIG. 10 the parts constructed identically to the corresponding parts of the preceding drawings are given identical reference numerals and the description thereof will be omitted.

Referring to FIG. 10, there is provided an auxiliary electrode 42 between the electrode 27 and the wafer 24 such that the electrode 42 is movable in the Z-direction along the path of the photoelectron beam 22a. The auxiliary electrode 42a, 42b provided at opposite sides of the planar photoelectron beam 22a and applied with a suitable correction voltage. As a result, a local electrical field is formed around the electrode 42 and the leakage or invasion of the electrical field into the space between the electrode 27 and the wafer 24 is cancelled by this local electrical field. As a result, the photoelectron beam 22a passes through the slit 27a of the electrode 27 as if there were not disturbance in the electrical field.

Figure 11:
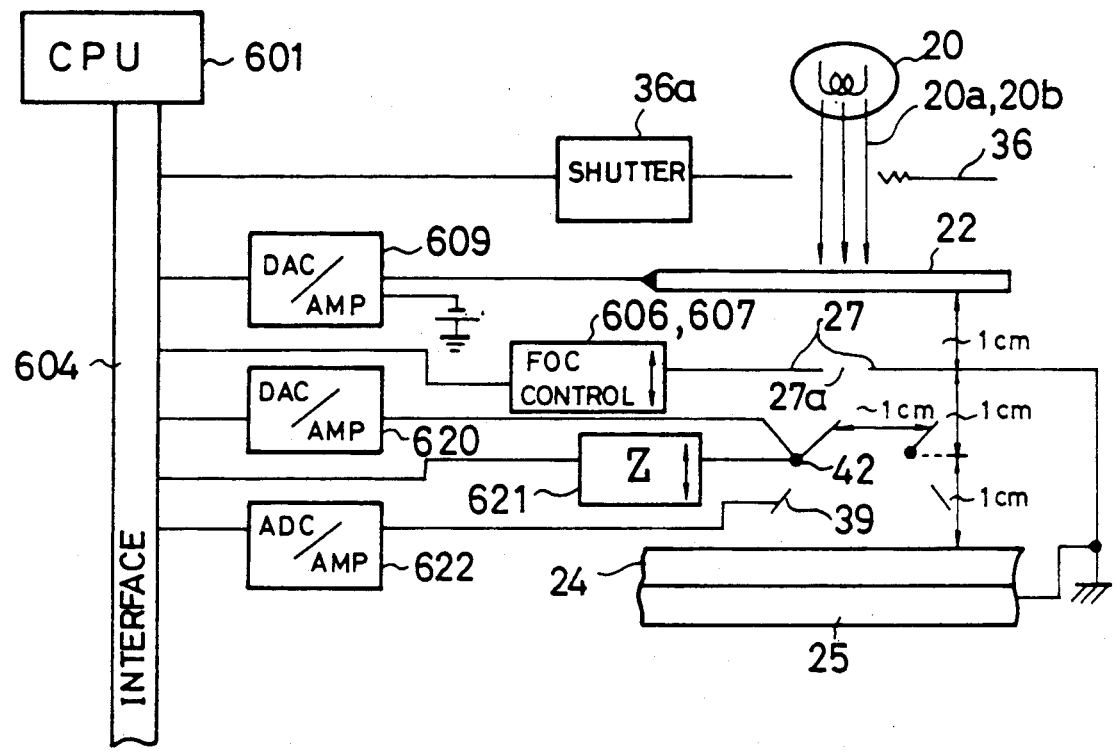
FIG. 11 is a more detailed diagram showing the overall construction of the apparatus of the second embodiment of the present invention.

FIG. 11 is a more detailed view of the second embodiment of the present invention. In FIG. 11 the parts constructed identically to corresponding parts described previously are given identical reference numerals and the description thereof will be omitted.

Referring to FIG. 11, the electrode 42 is supplied with a d.c. voltage from a controller 620 and is moved vertically by another controller 621. The controllers 620 and 621 are connected to the CPU 601 via the interface 604 and controlled by the CPU 601. As described previously, the auxiliary electrode 42 comprises a pair of rod shaped electrodes 42a, 42b which are separated about 1 cm apart and the same are positioned at a level of about 1 cm above the wafer 24. Further, the electrode 27 is positioned about 1 cm above the electrode 42. The electrode 27 in turn is disposed below the photoelectron mask 22 at a distance of about 1 cm. In other words, the auxiliary electrode 42 is provided at a generally mid-position between the electrode 27 and the stage 25 supporting the wafer 24. Further, it should be noted that the electrode detector 39 for back-scattered electrons is provided not on the electrode 27 as in the example of FIG. 6 but is held at a mid-position between the auxiliary electrode 42 and the wafer 24. The output of the detector 39 is processed in a processor 622 and is supplied to the CPU 601.

The procedure for correcting the distortion of the projected image on the wafer 24 using the auxiliary electrode 42 is described with reference to FIG. 11. First, a particular portion of the wafer 24 provided for positioning purposes is irradiated by the photoelectron beam 20a. This particular portion of the wafer may be a small projection or depression formed on a predetermined portion of the wafer 24. For this purpose, a photoelectron beam having a small cross-section emitted from a particular marking part in the pattern on the mask 22 is used as will be described with reference to another embodiment of the present invention. Next, back-scattered electrons emitted from the wafer 24 responsive to the irradiation of the photoelectron beam are detected by the electron detector 39, and the detector 39 produces an output signal indicating the intensity of the detected back-scattered electrons. This output of the detector 39 is then processed by the processor 622 and data indicating the detection of the particular portion of the wafer for positioning purposes is produced. Next, responsive to the detection of the particular portion on the wafer 24 as described, the CPU 601 calculates the deviation in the position of the focused photoelectron beam or beam spot from the expected position of the photoelectron beam estimated from the marking area on the pattern on the mask 22. Further, the CPU 601 controls the photoelectron mask 22, the electrode 27, and the auxiliary electrode 43 via respective controllers such that the predicted position of the beam spot coincides with the actual position of the beam spot of the photoelectron beam used for the positioning.

Next, the reason the auxiliary electrode 42 for correcting the path of the photoelectron beam 22a is located in the vicinity of the mid-position between the electrode 27 and the wafer 24 as well as the function of the electrode 42 will be described in detail.

Figure 12:
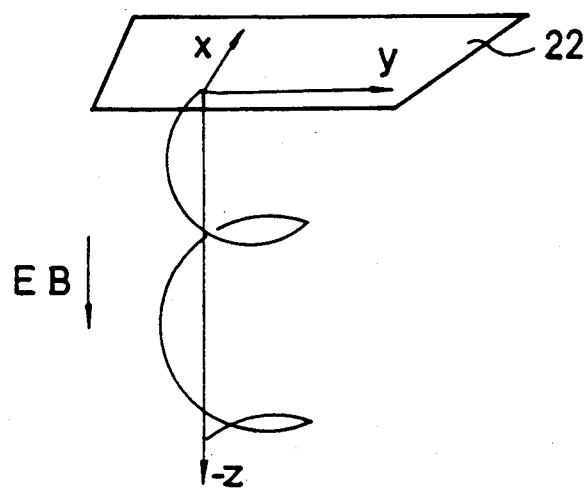
FIG. 12 is a diagram showing a path of a photoelectron in the apparatus of FIG. 11.

FIG. 12 shows an orbit of a photoelectron emitted from the photoelectron mask 22 and arriving at the surface of the wafer 24 under the acceleration and focusing action of the electrical and magnetical fields E and B. Thus, the photoelectron moves in a $-Z$ direction towards the wafer 24 along a spiral orbit. In other words, the photoelectron undergoes a circular motion in the X-Y plane under the magnetic field B and at the same time moves in the $-Z$ direction under the acceleration influence of the electrical field E. The electron is accelerated in the region between the photoelectron mask 22 and the slit 27a of the electrode 27, but thereafter moves at a constant speed because there is no accelerating electrical field between the electrode 27 and the wafer 24. The X- and Y-coordinates of a photoelectron moving along such an orbit can be represented by the following equation:

$$X = a \cdot \sin \omega t$$

$$Y = a \cdot (1 - \cos \omega t),$$

where a is a constant, $\omega$ is the angular velocity, t is the time after the electron has been emitted from the photoelectron mask 22, and m is the mass of the electron. In this latter regard, $\omega$ satisfies the relationship $\omega = e \cdot B / m$.

Further, the Z-coordinate of the photoelectron is represented by $$Z = e \cdot E / 2m \cdot t^2 + v_0 \cdot t$$

for the region of uniform acceleration between the photoelectron mask 22 and the slit 27a, and $$Z = v \cdot t$$

for the region of constant velocity motion between the slit 27a and the wafer 24. In these equations, $v_o$ stands for the initial velocity of the photoelectron in the Z-direction when the photoelectron is emitted from the photoelectron mask 22 and v stands for the velocity of the photoelectron in the Z-direction when the photoelectron passes through the slits 27a.

FIGS. 13(a) and (b) show the X- and Y-coordinates of the orbit of the photoelectron specified by the aforementioned set of equations. From this orbit, it is clear that the effect of the disturbance on the photoelectron due to the locally disturbed electrical field in the vicinity of the slit 27a extending in the Y-direction can be minimized if the electrode 27 is moved such that the local electrical field N1 caused by the slit 27a at a level M2 coincides with a first focusing point M1 of the photoelectron orbit where the photoelectron emitted from the photoelectron mask 22 returns to its origin (X=0, Y=0) in the X-Y plane.

The distortion component $\Delta$ of the image of the pattern at the surface of the wafer 24 can be calculated by the following equations:

$$\Delta \text{ (sin term)} \alpha \left[ \int_o^d + \int_d^{3d} \right] \times f_s(z)/B \cdot \sin\omega t \cdot dz$$

and $$\Delta \text{ (1 − cos term)} \alpha \left[ \int_o^d + \int_d^{3d} \right] \times f_s(z)/B \cdot (1 - \cos\omega t) \cdot dz$$

where $f_s(z)$ is a distribution function of the electrical field in the vicinity of the slit 27a, d is the distance between the photoelectron mask 22 and the electrode plate 27, 2d is the distance between the photoelectron mask 22 and the auxiliary electrode 42, and 3d is the distance between the photoelectron mask 22 and the wafer 24.

Figure 14C:
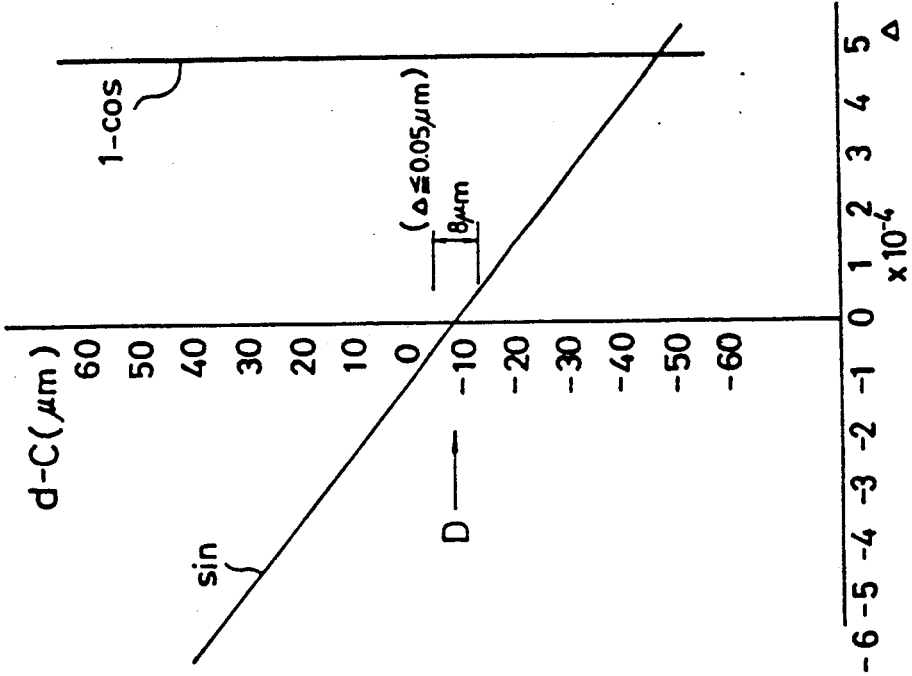
Figure 14D:
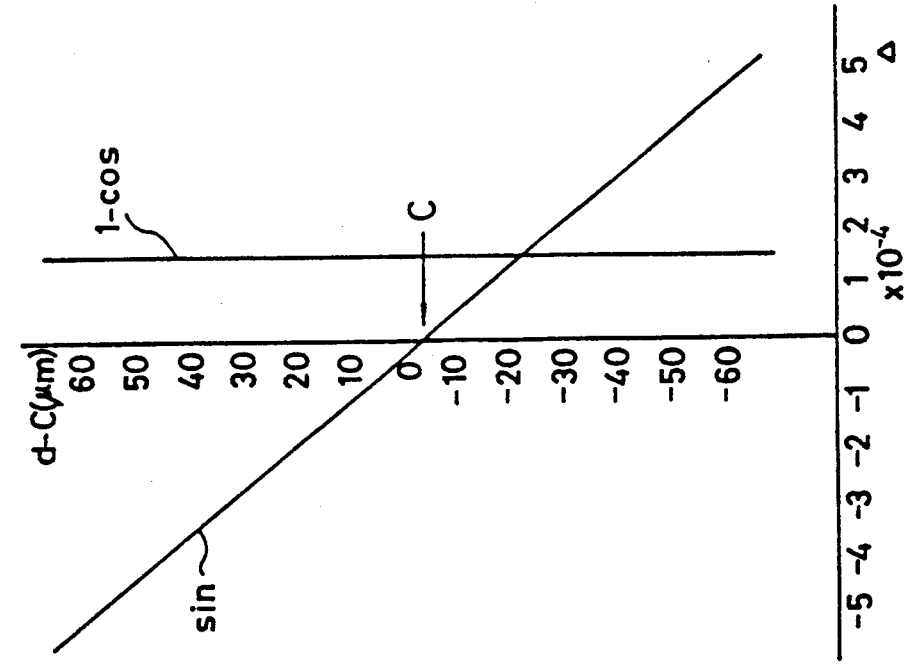

FIGS. 14 (a) through (d) show the sine term corresponding to the gain component and the cosine term corresponding to the rotation component of the distortion $\Delta$ for various settings of the photo-cathode image projection apparatus in which FIG. 14(a) shows the case in which the distance d is chosen to be 10 mm and the slit thickness d2 (FIG. 4) is chosen to be 400 $\mu$m, FIG. 14(b) shows the case in which the distance d is chosen to be 10 mm and the slit thickness d2 is chosen to be 500 $\mu$m, FIG. 14(c) shows the case in which the distance d is chosen to be 10 mm and the slit thickness d2 is chosen to be 666 $\mu$m, and FIG. 14(d) shows the case in which the distance d is chosen to be 10 mm and the slit thickness d2 is chosen to be 1000 $\mu$m. In these drawings, the ordinate d−C represented the difference in the level between the electrode 27 and the photoelectron mask 22 and the abscissa represents the distortion due to the sine and cosine terms. As can be seen from these drawings, the sine term of the distortion can be eliminated by optimizing the Z-coordinate of the electrode 27 as indicated by arrows A-D. However, the cosine term of the distortion is not eliminated by such an adjustment. It should be noted that the sine term of the distortion $\Delta$ corresponds to the vector a and the cosine term corresponds to the vector b of the distortion components shown in FIG. 9(B).

In order to correct such distortions which are not eliminated by the adjustment of the position of the electrode plate 27, the present embodiment uses the auxiliary electrode 42 as shown in FIG. 10 which produces an electrical field N2 having a polarity opposite to that of the electrical field N1 at the level of 2d which is approximately the mid-point between the electrode 27 and the wafer 24. Thus, a voltage of negative polarity is applied to the auxiliary electrode 42 through the controller 620. It is preferred to construct the electrode 42 in the form of the pair of rod shaped electrodes 42a, 42b disposed in parallelism to the slit 27a at opposite sides of the path of the photoelectron beam 22a as illustrated in FIG. 10.

It should be noted that the electrical field N2 by the auxiliary electrode 42 does not affect the sine term of the distortion $\Delta$ but only affects the cosine term of the distortion and rotates the image projected on the wafer 24. Such a modification in the shape of the image by the auxiliary electrode 42 cancels out the rotational distortion component caused by the electrode plate 27. Thus, the sine term of distortion corresponding to the gain component represented by the vector a in FIG. 9 is corrected by adjustment of the level of the electrode 27 and the cosine term of distortion corresponding to the rotational component represented by the vector b in FIG. 9 is corrected by the auxiliary electrode 42. As a result, the image projected on the wafer 24 becomes free from distortion. Further, the present embodiment prevents electrical discharge between the photoelectron mask 22 and the wafer 24.

In the embodiment described heretofore, the auxiliary electrode 42 is formed form a pair of rod shaped electrodes disposed at opposite sides of the photoelectron beam 22a such that the electrode is movable in the Z-direction by the controller 621. However, the auxiliary electrode 42 is not limited to such an embodiment but may be formed from a plurality of electrode pairs as shown in FIG. 10 in the solid line and the broken line. Each of the plurality of electrode pairs is applied with a suitable voltage so that the position of the maximum intensity of the electrical field N2 is adjustable. According to this modification, the complex mechanism related to the controller 621 for movement of the electrode 42 in the Z-direction can be eliminated and the construction of the apparatus becomes simple.

Further, the form of the auxiliary electrode 42 is not limited to rod-shaped electrodes as illustrated but a flat panel electrode defined with opening for the photoelectron beam may be used similarly. Further, the electrical voltage applied to the auxiliary electrode 42 is not limited to a negative voltage as illustrated but a positive voltage may be used in combination with a negative voltage. In this case, the path of the photoelectron beam 22a can be deflected uniformly.

In the photo-cathode image projection apparatus described heretofore, only a narrow image, corresponding to a part of the pattern of the photoelectron mask 22 irradiated by the optical beam 20b, is obtained on the wafer 24 at any one time. In order to transfer the entire pattern of the photoelectron mask 22, therefore, it is necessary to move the optical beam 20b across the surface of the photoelectron mask 22 so that the photoelectron beam 22a is moved in correspondence thereto over the surface of the wafer 24.

In such an apparatus, there is a problem of dynamic focusing in which the focusing of the photoelectron beam changes as the photoelectron beam 22a moves over the surface of the wafer 24 due to non-flat irregularities in the surface of the wafer 24. Further, there is a "stig" problem whereby the photoelectron beam spot becomes elongated in a radial direction on the wafer when the photoelectron beam irradiates a marginal part of the wafer 24.

In the actual exposure of the wafer to photoelectron beam irradiation, it is advantageous to transfer the image of the pattern of the photoelectron mask 22 continuously for a number of areas on the wafer 24. When performing such a continuous exposure, the distortion component for one area of the wafer 24 on which the image is to be projected can be different from the distortion component in another area remote from the aforesaid area. It is therefore preferred to correct such distortion continuously and automatically.

Figure 15:
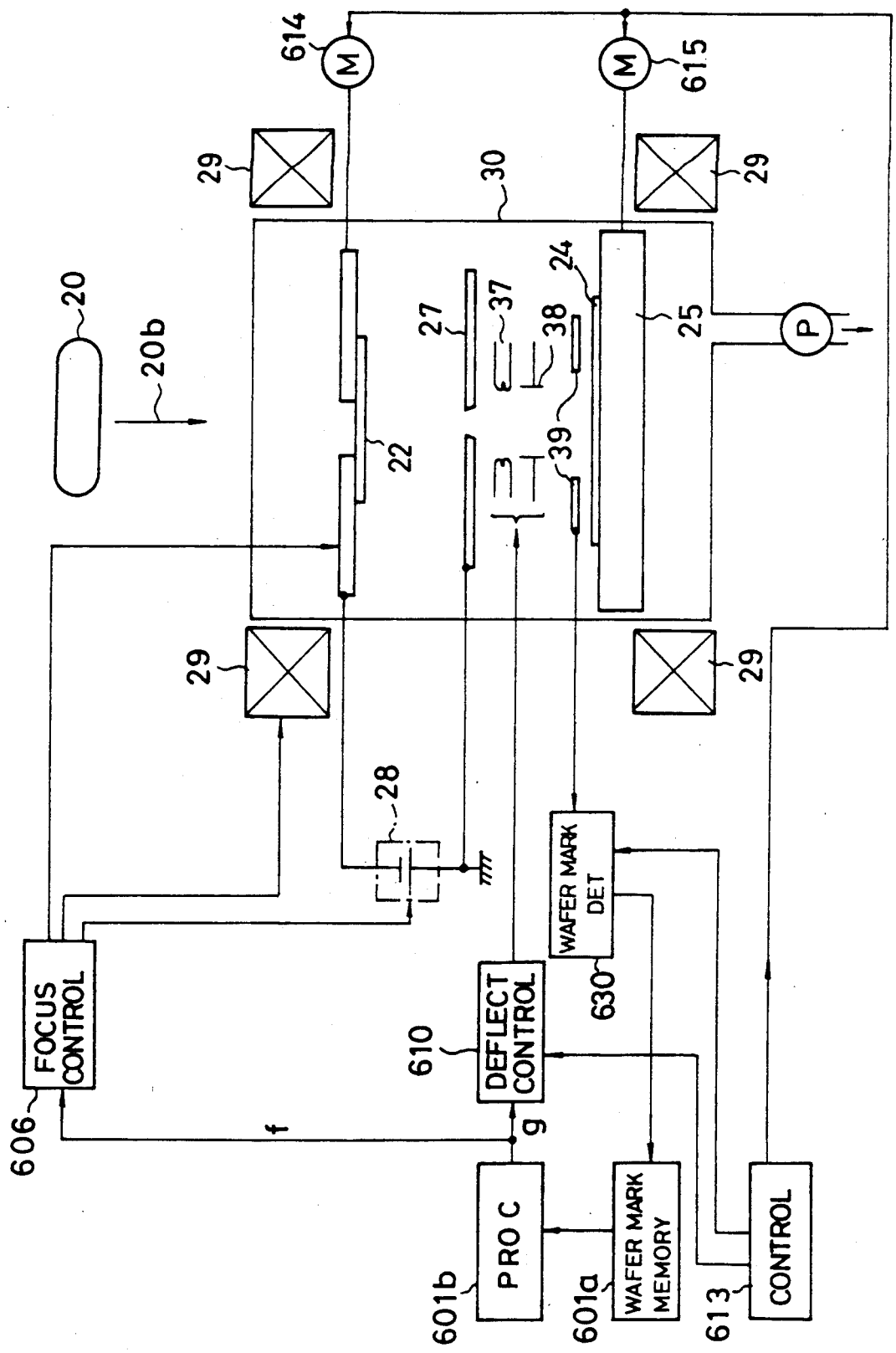
FIG. 15 is a diagram showing the general construction of a third embodiment of the apparatus of the present invention.

FIG. 15 shows a third embodiment of the present invention wherein the problems aforementioned are eliminated. In FIG. 15 the parts constructed identically to the corresponding parts in the preceding drawings are given identical reference numerals and the description thereof will be omitted.

Referring to FIG. 15, the photo-cathode image projection apparatus of the present embodiment comprises a wafer mark detector 630 which detects the deviation in position of the photoelectron beam on the wafer 24 from a predicted position which is defined with respect to a wafer mark provided on the wafer 24 for positional reference purposes. Examples of the wafer marks can be seen in FIG. 16(B) in which the small rectangular projections or depressions designated by $$a_{N-1}-d_{N-1}, a_N-d_N, a_{N+1}-d_{n+2}, a_{N+2}, d_{n+2}..$$

are the wafer marks. The wafer mark detector 630 is supplied with the information indicating the center of these wafer marks from the stage controller 613 for example, and detects the deviation of the photoelectron beam from the center of the wafer mark on the basis of the signal from the back-scattered electron detector 39 indicating the intensity of the back-scattered electrons from a region of the wafer including the wafer mark. The wafer mark detector 630 then produces data indicating the deviation of the photoelectron beam from its predicted position and the data thus produced is stored in a memory 601a cooperating with a processor 601b. Further, the stage controller 613 controls the deflection controller 610 which moves the photoelectron beam to the position corresponding to the wafer mark $a_N-d_N$ for the detection of the wafer mark. The data store din the wafer mark memory 601a is then read out by the processor 601b which may be a part of the CPU 601. The processor 601b in turn controls the focusing controller 606 by supplying a control signal f and the deflection controller 610 by supplying a control signal g and the position of the photoelectron beam on the wafer 24 is moved responsive to the value of the control signals f and g such that the distortion of the projected image is eliminated.

Figure 16A:
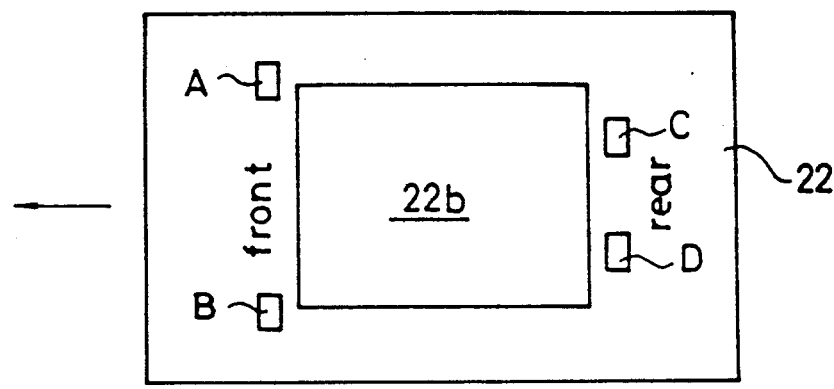
FIGS. 16(A) and (B) are plan views showing a series of positioning marks provided on the mask in correspondence to numerous patterns arranged in row.

FIG. 16(A) shows mask marks A-D provided on the photoelectron mask 22 in correspondence to the wafer marks $a_N$–$d_N$. These mask mars are used as the source region for producing the photoelectron beam used to irradiate the wafer marks $a_N$–$d_N$. The mask marks A and B are positioned at a front side of an area 22b of the pattern of the photoelectron mask 22 and the mask marks C and D are positioned at a rear side of the area 22b. Here, the front side means the side of the area 22b facing the direction in which the photoelectron mask is moved and the rear side is defined as the side of the area 22b opposite to the front side. Further, the separation between the mask marks A and B may be made larger than the separation between the mask marks C and D as illustrated in FIG. 16 (A).

Figure 16B:
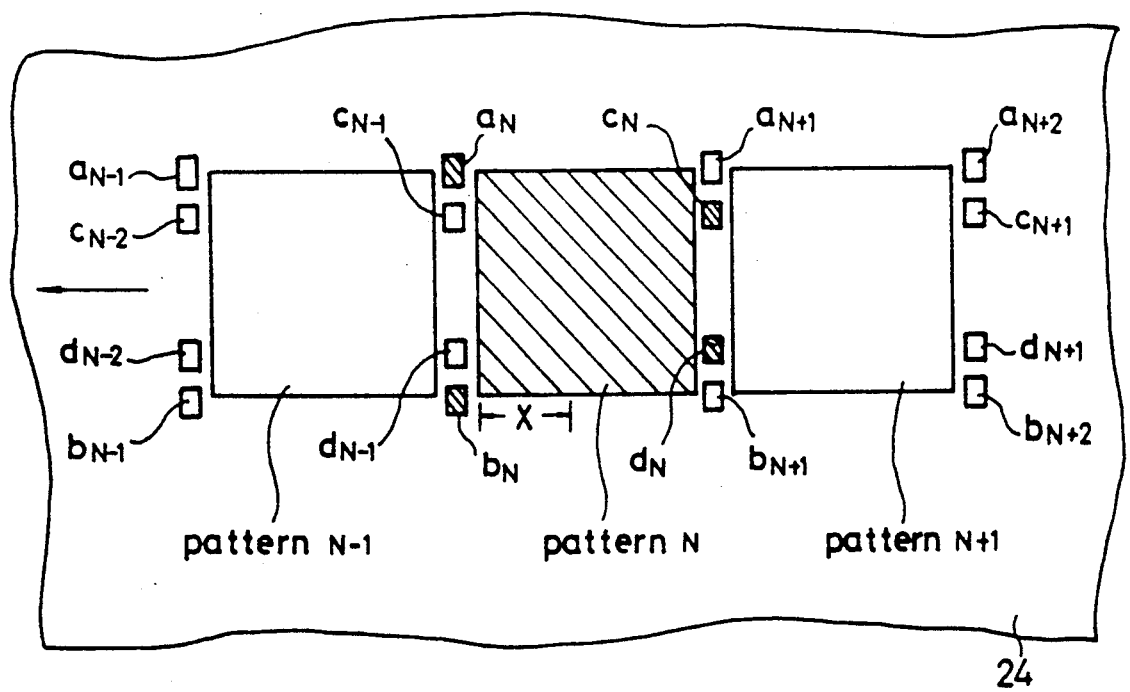

The wafer 24 is exposed to the photoelectron beam irradiation according to the pattern 22b on the photoelectron mask 22 consecutively, and there is formed a stripe of transferred patterns N−1, N, N+1, ... as illustrated in FIG. 16(B). For each of such patterns on the wafer, the wafer marks are provided such as the wafer marks $a_{n-1}$–$d_{n-1}$ for the pattern N−1, the wafer marks $a_N$–$d_N$ for the pattern N, and the wafer marks $a_{n+1}$–$d_{n+1}$ for the pattern N+1.

Figure 17A:
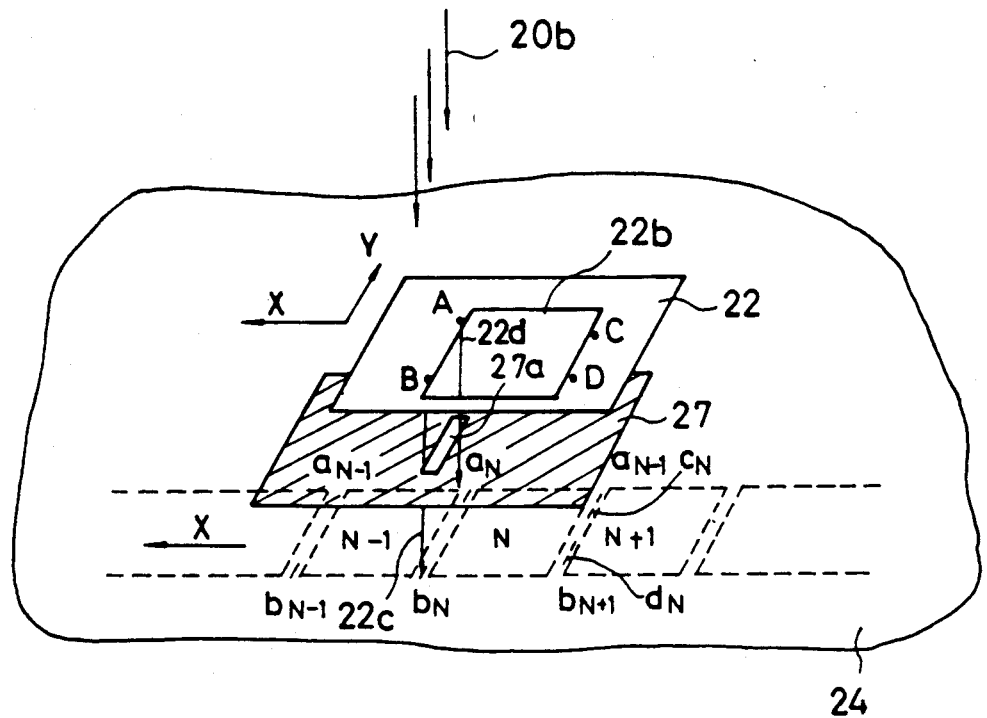
FIGS. 17(A) and (B) are diagrams showing the alignment of positioning marks provided on a mask for correction of the image projected on the wafer for the continuous exposure of numerous patterns on the wafer in succession.
Figure 17B:
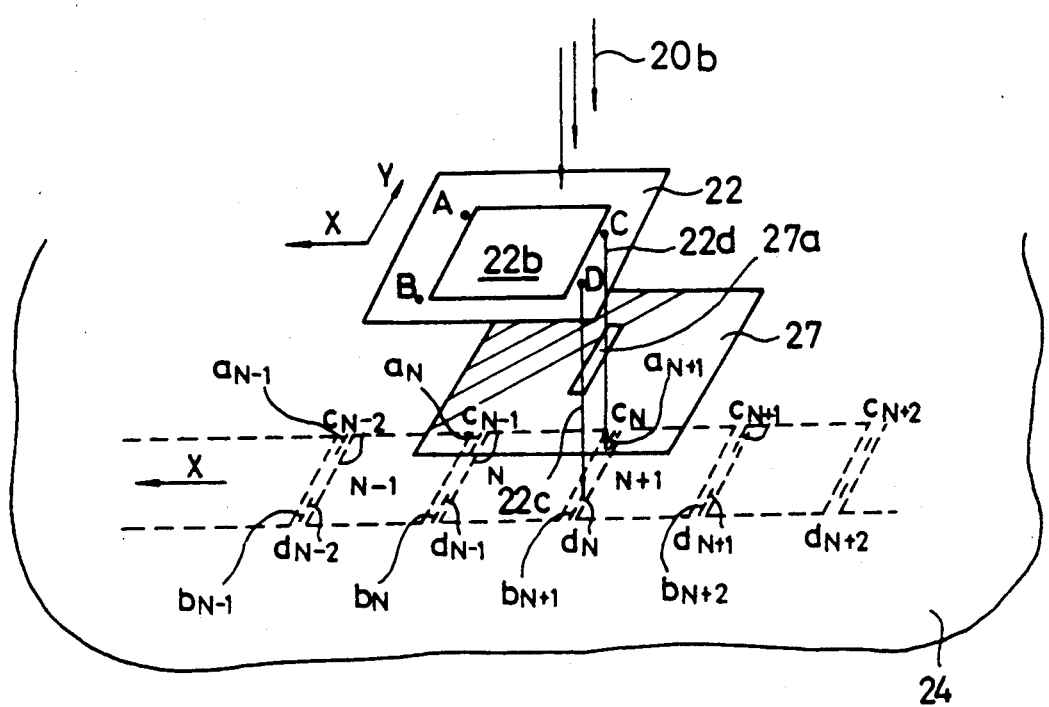

Next, the operation of the photo-cathode image projection apparatus of the present embodiment will be described with reference to FIGS. 17(A) and (B). In FIGS. 17(A) and 17(B) the parts constructed identically to the corresponding parts in the preceding drawings are given identical reference numerals and the description thereof will be omitted.

Referring to FIG. 17(A), the optical beam 20b is irradiated on the photoelectron mask 22 while the photoelectron mask 22 and the wafer 24 are moved together in the direction X. Responsive to the irradiation of the mask marks A and B by the optical beam 20b, photoelectron beams 22c and 22d are produced from the mask marks A and B and the photoelectron beams 22c and 22d hit the corresponding wafer marks $b_N$ and $a_N$. Responsive thereto, the wafer mark detecting apparatus 630 detects the deviation in position of the photoelectron beams 22c and 22d on the wafer 24 and the position thus obtained is stored in the memory 501a. At the same time, the photoelectron mask 22 and the wafer 24 are moved in the X-direction at a constant speed, and after a predetermined time, the optical beam 20b irradiates the mask marks C and D as shown in FIG. 17(B). Responsive thereto, the photoelectron beams 22c and 22d hit the wafer marks $c_N$ and $d_N$, and the deviation in position of the photoelectron beams 22c and 22d is determined by the wafer mark detecting apparatus 630 on the basis of the back-scattered electrons emitted from the wafer marks $c_N$ and $d_N$. The deviation of the photoelectron beams 22c and 22d thus obtained is stored in the memory 601a similarly to the case of the wafer marks $a_N$ and $b_N$. As a result, four data points representing the deviation of the photoelectron beam are obtained and the processor controls the focusing controller 606 and the deflection controller 610 such that the distortion in the projected image on the wafer 24 is corrected. Further, the processor 601b controls the photoelectron beam for eliminated stig and dynamic focusing of the photoelectron beam as will be described.

Next, the operation of the processor 601b for elimination of the problem of stig and dynamic focusing will be described. First, the processor 601b controls the focusing controller 606 by the control signal f such that the photoelectron beams 22c and 22d are properly focused on the wafer 24 at the area of the wafer including the wafer marks $a_N$ and $b_N$, for example. At the same time, the processor 601b controls the deflection controller 610 by the control signal g such that the beam has a proper square beam spot on the wafer 24 at the same area. Further, the processor 601b stores the value of the control signals f and g for controlling the focusing controller 606 and the deflection controller 610 determined as such. Next, the processor repeats the operation described for the area of the wafer 24 including the wafer marks $c_N$ and $d_N$ and stores the value of the control signals f and g for controlling the focusing controller 606 and the deflection controller 610 determined as such. Then, the processor 601b calculates the value of the control signals f and g for an arbitrary point x between the wafer marks $a_N$, $b_N$ and the wafer marks $c_N$, $d_N$ according to an equation:

$$T(x) = (1-x) \cdot T_1 + x \cdot T_2 \quad (1)$$

where $T(x)$ stands for the value of the control signals f and g for achieving the proper focusing and shaping of the photoelectron beam 22a on the wafer 24 at a position separated by a distance x from a side or edge of the pattern such as the pattern N on the wafer 24 which is close to the pairs of wafer marks $a_N$ and $b_N$ as shown in FIG. 16(B), $T_1$ stands for the magnitude of the control signals to be supplied to the controllers 606 and 610 in order to establish a proper focusing and proper shaping of the photoelectron beams 22c and 22d at the pair of wafer marks $a_N$ and $b_N$, and $T_2$ stands for the magnitude of the control signals to be supplied to the controllers 606 and 610 in order to establish a proper focusing and proper shaping of the photoelectron beams 22c and 22d at another pair of wafer marks such as $c_N$ and $d_N$.

By controlling the control signals f and g to be supplied to the controller according to the interpolation using the above equation, the problem of deviation in the focusing and the deformation of the beam spot in the area of the wafer located between wafer marks can be successfully eliminated. By repeating the procedure, control of the photoelectron beam can be performed continuously for a number of patterns N−1, N, N+1, ... as shown in FIG. 17(B) without intervention by an operator.

Further, the equation for interpolation of the control signals f and g is not limited to such a linear equation but a parabolic equation such as $$T(x) = (1-x) \; T_1 + x \cdot T_2 + x \cdot (1-x) \cdot T_x \quad (2)$$

may be used when a number of wafer marks $a_{n-1}$–$d_{N-1}$, $a_N$–$d_N$, $a_{n+1}$–$d_{n+1}$, ... are used for correction of the photoelectron beam. In this equation, $T_1$ for example represents the control signals f and g when the photoelectron beams 22c and 22d hit the part of the wafer 24 including the wafer marks $a_{N-1}$ and $b_{N-1}$ and $T_2$ represents the control signals f and g when the photoelectron beams 22c and 22d hit the part of the wafer 24 including the wafer marks $a_{n+1}$ and $b_{N+1}$ shown in FIG. 17(B). Further, $T_3$ represents a parameter obtained by fitting the value of the control signals f and g determined for all of the wafer marks $a_{N-1}$–$d_{N-1}$, $a_N$–$d_N$, $a_{N+1}$–$d_{N+1}$, ... by the above second order equation.

It should be noted that the Equation (2) is not limited to the interpolation of the control signals f and g but may be applicable to the correction of the distortion of the image on the wafer 24 represented by distortion components such as the gain component and the rotational component. Generally, the distortion of the image further comprises an offset component indicating the translation of the image on the wafer and a trapezoidal distortion component indicating a change in magnification of image within the pattern on the wafer 24. When correcting such distortion components, each of the four distortion components is obtained for the patterns $N-1$, $N$, and $N+1$ shown in FIG. 17(B) using the wafer marks $a_{N-1}-d_{N-1}$, $a_N-d_N$, and $a_{N+1}-d_{N+1}$, and the values of the distortion component for these patterns $N-1$, $N$ and $N+1$ are fitted according to Equation (2). As a result, the distortion of the image on the wafer 24 can be corrected for a wide area such as the area for the patterns $N-1, N, N+1, \ldots$ with a very high precision.

Finally, FIG. 18 shows a modification of the apparatus of FIG. 15 in which parts constructed identically to the corresponding parts of FIG. 15 are given identical reference numerals and the description thereof will be omitted. In this modification, the focusing coil 26 is replaced by a permanent magnet 26' and the optical beam 20b from the light source 20 is incident to the photoelectron mask 22 obliquely as illustrated. Other constructional features of the apparatus are substantially the same as the apparatus described with reference to FIG. 15 and the description thereof will be omitted.

Further, the present invention is not limited to these embodiments described heretofore but various variations and modifications may be made without departing from the scope of the present invention.

What is claimed is:

1. A photo-cathode image projection apparatus for projecting an image of a desired pattern on an object by a focused photoelectron base, comprising:

light source means for producing an optical beam;

photoelectron mask means disposed so as to be irradiated by the optical beam from the light source means, said photoelectron mask means including a photoelectron mask patterned according to said desired pattern with a material emitting photoelectrons in response to irradiation by said optical beam;

focusing means for focusing the photoelectrons emitted from the photoelectron mask to form a focused photoelectron beam that is focused on an object;

acceleration electrode means disposed in the path of the photoelectron beam for accelerating the photoelectrons in the photoelectron beam;

a single elongated passage defined in said acceleration electrode means for allowing a part of the photoelectron beam to pass therethrough, said elongated passage providing an elongated cross-section in the photoelectron beam passing therethrough;

stage means disposed for supporting the said object so that the part of the photoelectron beam passed through the elongated passage means is focused on the object;

additional electrode means provided between the stage means and the acceleration electrode including an electrode element disposed at each side of the photoelectron beam which has passed through the elongated passage so as to extend along the elongated cross-section of the photoelectron beam for correcting the path of the photoelectron beam as it travels toward the object; and voltage source means for applying an acceleration voltage between the photoelectron mask and the acceleration electrode means and holding said acceleration electrode means at an electrical potential level identical to the electrical potential level of the stage means, so that the object supported on the stage means is electrically shielded from said photoelectron mask by the acceleration electrode means.

2. A photo-cathode image projection apparatus as claimed in claim 1 in which said light source means irradiates the photoelectron mask obliquely to a major plane of the photoelectron mask.

3. A photo-cathode image projection apparatus as claimed in claim 1 further comprising transport means for moving said photoelectron mask means and said stage means at a predetermined speed relative to said acceleration electrode means in a plane that is perpendicular to the general direction of the photoelectron beam.

4. A photo-cathode image projection apparatus as claimed in claim 3 in which said transport means moves the photoelectron mask means and the stage means such that relative speed between the photoelectron mask means and the acceleration electrode means is different than the relative speed between the photoelectron mask means and the stage means.

5. A photo-cathode image projection apparatus as claimed in claim 5 further comprising mask position detecting means for detecting the position of the photoelectron mask mans and producing an output signal indicating the position of the photoelectron mask means, stage position detecting means for detecting the position of the stage means and producing an output signal indicating the position of the stage means, control means for receiving said output signals from said mask position detecting means and stage position detecting means and producing an output signal indicating the deviation in position between the photoelectron mask means and the stage means, and first deflection means for deflecting the photoelectron beam responsive to the output signal from the control means, so that the image corresponding to the desired pattern on the photoelectron mask is projected precisely on said object.

6. A photo-cathode image projection apparatus as claimed in claim 1 further comprising back-scattered electron detection means between said acceleration electrode means and said object on the stage means for detecting back-scattered electrons emitted from said object responsive to irradiation by said photoelectron beam and producing a second output signal indicating a deviation in alignment of said photoelectron mask means to said stage means, and deflection means for deflecting the photoelectron beam responsive to said second output signal of the back-scattered electron detection means, so that the deviation in position of the image on the object due to deviation in alignment of the photoelectron mask and the stage means is corrected.

7. A photo-cathode image projection apparatus as claimed in claim 6 in which said back-scattered photoelectron detection means detects the deviation on the basis of irradiation of positional reference mark means provided on said object by the photoelectron beam.

8. A photo-cathode image projection apparatus as claimed in claim 1 further comprising means for moving the acceleration electrode means in a direction that is parallel to the general direction of the photoelectron beam such that the photoelectron beam is focused on said acceleration electrode means.

9. A photo-cathode image projection apparatus as claimed in claim 1 in which said additional electrode means is movable in a direction toward and away from the acceleration electrode means.

10. A photo-cathode image projection apparatus as claimed in claim 1 in which said additional electrode means comprises a plurality of electrode aligned along the photoelectron beam passing through the passage and reaching the object on the stage means.

11. A photo-cathode image projection apparatus for projecting an image of a desired pattern on an object by a focused photoelectron beam, comprising:

light source means for producing an optical beam;
a photoelectron mask means disposed so as to be irradiated by the optical beam from the light source, said photoelectron mask means including a photoelectron mask patterned according to said desired pattern with a material emitting photoelectrons in response to irradiation by said optical beam;
focusing means for focusing the photoelectrons emitted from the photoelectron mask to form a focused photoelectron beam that is focused on an object;
acceleration electrode means disposed in the path of the photoelectron beams for accelerating the photoelectrons in the photoelectron beam;
elongated passage means defined in said acceleration electrode means for allowing a part of the photoelectron beam to pass therethrough;
stage means disposed for supporting the said object to that the part of the photoelectron beam passed through the elongated passage means is focused on the object; and
voltage source means for applying an acceleration voltage between the photoelectron mask and the acceleration electrode means and holding said acceleration electrode means at an electrical potential level identical to the electrical potential level of the stage means, so that the object supported on the stage means is electrically shielded from said photoelectron mask by the acceleration electrode means,
said light source means comprising means for causing the optical beam to have an elongated cross-section which extends in parallelism to the elongated passage means in the acceleration electrode means, and which cross-section has a width, measured longitudinally of the elongated passage means, that is substantially less than the corresponding width of the passage means, and which cross-section has a thickness, measured across the passage means, that is substantially less than the corresponding thickness of the passage means.

12. A photo-cathode image projection apparatus for projecting an image of a desired pattern on an object by a focused photoelectron beam, comprising:

light source means for producing an optical beam;
a photoelectron mask means disposed so as to be irradiated by the optical beam from the light source, said photoelectron mask means including a photoelectron mask patterned according to said desired pattern with a material emitting photoelectrons in response to irradiation by said optical beam;
focusing means for focusing the photoelectrons emitted from the photoelectron mask to form a focused photoelectron beam that is focused on an object;
acceleration electrode means disposed in the path of the photoelectron beams for accelerating the photoelectrons in the photoelectron beam;
a single elongated passage means defined in said acceleration electrode means for allowing a part of the photoelectron beam to pass therethrough;
stage means disposed for supporting the said object so that the part of the photoelectron beam passed through the elongated passage means is focused on the object; and
voltage source means for applying an acceleration voltage between the photoelectron mask and the acceleration electrode means and holding said acceleration electrode means at an electrical potential level identical to the electrical potential level of the stage means, so that the object supported on the stage means is electrically shielded from said photoelectron mask by the acceleration electrode means,
said light source means comprising a laser source whereby the optical beam is a laser beam, and deflecting means for deflecting the laser beam such that the laser beam scans across the photoelectron mask.

13. A photo-cathode image projection apparatus for projecting an image of a desired pattern on an object by a focused photoelectron beam, comprising:

a light source means for producing an optical beam;
photoelectron mask means disposed so as to be irradiated by the optical beam from the light source, said photoelectron mask means including a photoelectron mask patterned according to said desired pattern with a material emitting photoelectrons in response to irradiation by said optical beam;
focused means for focusing the photoelectrons emitted from the photoelectron mask to form a focused photoelectron beam that is focused on an object;
acceleration electrode means disposed in the path of the photoelectron beams for accelerating the photoelectrons in the photoelectron beam;
elongated passage means defined in said acceleration electrode means for allowing a part of the photoelectron beam to pass therethrough;
stage means disposed for supporting the said object so that the part of the photoelectron beam passed through the elongated passage means is focused on the object;
voltage source means for applying an acceleration voltage between the photoelectron mask and the acceleration electrode means and holding said acceleration electrode means at an electrical potential level identical to the electrical potential level of the stage means, so that the object supported on the stage means is electrically shielded from said photoelectron mask by the acceleration electrode means; and
means for moving said light source means and said acceleration electrode means in synchronization to each other.

14. A photo-cathode image projection apparatus for projecting an image of a desired pattern on an object by a focused photoelectron beam, comprising:

light source means for producing an optical beam;
photoelectron mask means disposed so as to be irradiated by the optical beam from the light source, said photoelectron mask means including a photoelectron mask patterned according to said desired pattern with a material emitting photoelectrons in response to irradiation by said optical beam;

focusing means for focusing the photoelectrons emitted from the photoelectron mask to form a focused photoelectron beam that is focused on an object;

acceleration electrode means disposed in the path of the photoelectron beams for accelerating the photoelectrons in the photoelectron beam;

elongated passage means defined in said acceleration electrode means for allowing a part of the photoelectron beam to pass therethrough;

stage means disposed for supporting the said object so that the part of the photoelectron beam passed through the elongated passage means is focused on the object;

voltage source means for applying an acceleration voltage between the photoelectron mask and the acceleration electrode means and holding said acceleration electrode means at an electrical potential level identical to the electrical potential level of the stage means, so that the object supported on the stage means is electrically shielded from said photoelectron mask by the acceleration electrode means, said photoelectron mask means, the acceleration electrode means, and the stage means being located in an evacuated chamber, said chamber being divided into a first part including the photoelectron mask means and the acceleration electrode means and a second part including the stage means, and said first and second parts of the chamber being evacuatable separately such that the degree of vacuum in the first part is equal to or greater than the degree of vacuum in the second part.

15. A method of exposing an object to a photoelectron beam emitted from a photoelectron mask patterned with a material which emits photoelectron according to a designed pattern responsive to irradiation by light, and wherein the photoelectron beam is passed through an elongated slit defined in an electrode plate, said method comprising the steps of:

applying an electrical field and a magnetic field between said photoelectron mask and said plate such that the photoelectron beam emitted from said photoelectron mask is focused on said object;

irradiating the photoelectron mask with an optical beam having an elongated cross-section so that said mask emits a photoelectron beam having a correspondingly elongated cross-section which coincides with the shape of the elongated slit in the electrode, said emitted beam being projected in a general direction toward the object;

maintaining the object at an electrical potential level such that the electrical potential level of the object is identical to the electrical potential level of the electrode plate;

causing the photoelectron beam to pass through the elongated slit in the electrode plate; and moving the photoelectron mask and the object relative to the electrode plate and the optical beam in planes that are perpendicular to the general direction of the photoelectron beam and in directions that are perpendicular to elongated dimension of the cross-section of the photoelectron beam.

16. A method as claimed in claim 15 in which said step of causing the photoelectron beam to pass through the slit further comprises the step of focusing the photoelectron beam on said electrode plate before the beam is focused on the object.

17. A method as claimed in claim 15 in which said step of moving the photoelectron mask and the object relative to the electrode plate and the optical beam comprises the step of moving the photoelectron mask and the object in directions that are perpendicular to the elongated dimension of the slit at constant speeds.

18. A method as claimed in claim 17 in which the photoelectron mask and the object are moved at respective different speeds.

19. A method as claimed in claim 17 in which said step of moving the photoelectron mask and the object relative to the electrode plate and the optical beam comprises the step of moving the electrode plate and the optical beam in directions that are perpendicular to the elongated dimension of the slit at the same speed.

20. A method as claimed in claim 15 further comprising the steps of detecting a deviation in the position of the photoelectron beam on the object by using positioning reference marks provided on the object along the direction of the relative movement of the object, correcting the position of the photoelectron beam such that the deviation in the position of the photoelectron beam is eliminated for the region of the object on which the positioning reference marks are provided, optimziing the state of the photoelectron beam for said region of the object where the positioning reference marks are provided, and optimizing the state of the photoelectron beam for a region between the positioning marks by interpolation.

21. A method as claimed in claim 20 in which said step of detecting the deviation comprises the steps of irradiating the positioning reference marks onto the object by a photoelectron beam irradiated from the photoelectron mask at a source region provided on the photoelectron mask in correspondence to the positioning reference marks, and detecting the deviation in the position of the photoelectron beam thus irradiated on the object from the position of the positioning reference marks.

22. A method as claimed in claim 20 in which the interpolation is made according to the equation $$T(x)=(1-x).T_1+x.T_2$$

where T(x) is an optimized state of the photoelectron beam at a location on the object separated from a first set of positionin reference marks towards a second second set of positioning reference marks by a distance x, $T_1$ is an optimized state of the photoelectron beam at the first positioning reference marks, and $T_2$ is an optimized state of the photoelectron beam at the second positioning reference marks.

23. A method as claimed in claim 20 in which said state of the photoelectron beam is the position of the photoelectron beam on the object.

24. A method as claimed in claim 20 in which said state of the photoelectron beam is a stig of the photoelectron beam on the object.

25. A method as claimed in claim 20 in which said state of the photoelectron beam is a focusing state of the photoelectron beam on the object.

* * * * *

UNITED STATES PATENT AND TRADEMARK OFFICE
CERTIFICATE OF CORRECTION

PATENT NO. : 5,023,462
DATED : June 11, 1991
INVENTOR(S) : Akio Yamada, Kiichi Sakamoto, Jinko Kudou and Hiroshi Yasuda It is certified that error appears in the above-identified patent and that said Letters Patent is hereby corrected as shown below:

Title Page:
[56] References Cited - U.S. PATENT DOCUMENTS insert
--4,039,810    8/1977    Heritage ...... 250/396--;

FOREIGN PATENT DOCUMENTS insert
--2376510    7/28/78    France
  139325     5/2/85     Europe--;

Please Insert --OTHER DOCUMENTS
Patent Abstract of Japan, vol. 10, no. 300 (P-506)(2356) 14 Oct. 1986 & JP-A-61-117554 (Ushio Inc.) June 4, 1986.--

Column 2,  line 17, "i" should be --is--;
           line 46, "he" should be --the--.

Column 3,  line 32, "to" should be --of--.

Column 8,  line 6, "$1_1$" (second occurrence) should be --$1_2$--;
           line 19, "he" should be --the--.

Column 9,  line 28, "608" should be --609--;
           line 52, "24a" should be --22a--.

Column 11, line 60, "$\Delta$" should be --$\vec{\Delta}$--;
           line 62, "a" (second occurrence) should be --$\vec{a}$--;
           line 64, "b" should be --$\vec{b}$--;
           line 68, "a" should be --$\vec{a}$--.

Column 13, line 60, "w" should be --$\underline{w}$--;
           line 63, "w" should be --$\underline{w}$--;
           line 65, "w" should be --$\underline{w}$--;
           line 68, "w" should be --$\underline{w}$-- (both occurrence).

UNITED STATES PATENT AND TRADEMARK OFFICE
CERTIFICATE OF CORRECTION

PATENT NO. : 5,023,462

DATED : June 11, 1991

INVENTOR(S) : Akio Yamada, Kiichi Sakamoto, Jinko Kudou and Hiroshi Yasuda

It is certified that error appears in the above-identified patent and that said Letters Patent is hereby corrected as shown below:

Column 14, line 35, "a" should be --$\underline{a}$--, "$\int_d^{3d}$" should be --$\int_d^{3d}$--, and "w" should be --$\underline{w}$--;
line 42, "a" should be --$\underline{a}$--, "$\int_d^{3d}$" should be --$\int_d^{3d}$--, and "w" should be --$\underline{w}$--;
line 68, "represented" should be --represents--.

Column 15, line 9, "a" should be --$\vec{a}$--;
line 10, "b" should be --$\vec{b}$--;
line 34, "a" should be --$\vec{a}$--;
line 37, "b" should be --$\vec{b}$--;
line 44, "form" should be --from--.

Column 16, line 62, "din" should be --in--.

Column 17, line 6, "mars "should be --marks--;
line 46, "501a" should be --601a--.

Column 18, line 54 should be
--$T(x)=(1-x)\cdot T_{1+x}\cdot T_{2+x}\cdot (1-x)\cdot T_x$        (2)--.

Column 20, line 34, "mans" should be --means--;

Column 22, line 7, delete "means";
line 31, delete "a".

UNITED STATES PATENT AND TRADEMARK OFFICE
CERTIFICATE OF CORRECTION

PATENT NO. : 5,023,462

DATED : June 11, 1991

INVENTOR(S) : Akio Yamada, Kiichi Sakamoto, Jinko Judou and Hiroshi Yasuda

It is certified that error appears in the above-identified patent and that said Letters Patent is hereby corrected as shown below:

Column 24, line 52, "positionin" should be --positioning--.

Signed and Sealed this

Thirteenth Day of April, 1993

*Attest:*

STEPHEN G. KUNIN

*Attesting Officer*     *Acting Commissioner of Patents and Trademarks*